US012568798B2

(12) United States Patent
Ueki et al.

(10) Patent No.: US 12,568,798 B2
(45) Date of Patent: Mar. 3, 2026

(54) EXPANSION METHOD

(71) Applicant: DISCO CORPORATION, Tokyo (JP)

(72) Inventors: Atsushi Ueki, Tokyo (JP); Takayuki Masada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 199 days.

(21) Appl. No.: 18/181,241

(22) Filed: Mar. 9, 2023

(65) Prior Publication Data

US 2023/0298925 A1     Sep. 21, 2023

(30) Foreign Application Priority Data

Mar. 18, 2022    (JP) ................................. 2022-044627

(51) Int. Cl.
*H10P 72/70*          (2026.01)
*H10P 54/00*          (2026.01)
(52) U.S. Cl.
CPC .......... *H10P 72/7402* (2026.01); *H10P 54/00* (2026.01); *H10P 72/7416* (2026.01)
(58) Field of Classification Search
CPC ................. H01L 21/6836; H01L 21/78; H01L 2221/68327; H01L 2221/68336
See application file for complete search history.

(56) References Cited

U.S. PATENT DOCUMENTS

2019/0279903 A1* 9/2019 Zhao ...................... H01L 21/78

FOREIGN PATENT DOCUMENTS

JP      2012156400 A    8/2012
JP      2017059765    *  3/2017
JP      2019117891    *  7/2019

OTHER PUBLICATIONS

JP2019117891 machine translation (Year: 2019).*
JP2017059765 machine translation (Year: 2017).*

* cited by examiner

*Primary Examiner* — Alison L Hindenlang
*Assistant Examiner* — Alexander A Wang
(74) *Attorney, Agent, or Firm* — Greer Burns & Crain Ltd.

(57)                    ABSTRACT

An expansion method includes an expansion step of expanding a sheet between an outer periphery of a wafer and an inner periphery of an annular frame in a wafer unit, and a heating step of heating the sheet in its region between the outer periphery of the wafer and the inner periphery of the annular frame by a heating unit to allow slack of the sheet, the slack having been formed in the expansion step, to shrink. The region includes a first region, and a second region that is harder to shrink by the heating than the first region. On the sheet, heat spots of a temperature higher than that of the sheet surrounding the heat spots are formed with heat radiated to the sheet. In the heating step, the heating unit is moved such that the heat spots are positioned over an entirety of at least the second region.

1 Claim, 19 Drawing Sheets

CONTROLLER —100

EXPANSION METHOD

BACKGROUND OF THE INVENTION

Field of the Invention

The present invention relates to an expansion method for expanding a sheet of a wafer unit.

Description of the Related Art

To remove slack of a sheet made from a stretchable resin, the sheet is heated to allow it to shrink. It has been a conventional practice to heat such a sheet by circling and moving heaters, which face a region to be heated of the sheet, along the region (see, for example, JP 2012-156400A).

SUMMARY OF THE INVENTION

However, a sheet has a machine direction (MD) and a transverse direction (TD), and is hard to shrink at opposite ends thereof in the TD direction even when heated.

If a sheet is not allowed to shrink sufficiently, no sufficient space is formed between adjacent chips formed by dividing a wafer, so that during handling, the adjacent chips may be damaged through contact with each other.

The present invention therefore has as an object thereof the provision of an expansion method that allows a sheet to shrink by heating after its expansion.

In accordance with an aspect of the present invention, there is provided an expansion method for expanding a sheet of a wafer unit including a wafer, the sheet with the wafer bonded thereto, and an annular frame having an opening with the wafer accommodated therein and carrying the sheet bonded to the annular frame at an outer peripheral edge thereof. The expansion method includes an expansion step of expanding the sheet between an outer periphery of the wafer and an inner periphery of the annular frame in the wafer unit, and a heating step of, after performing the expansion step, heating the sheet in a region thereof, the region being to be heated, between the outer periphery of the wafer and the inner periphery of the annular frame by a heating unit to allow slack of the sheet, the slack having been formed in the expansion step, to shrink. The region to be heated of the sheet includes a first region, and a second region that is harder to shrink by the heating than the first region. On the sheet, heat spots of a temperature higher than that of the sheet surrounding the heat spots are formed with heat radiated from the heating unit to the sheet. In the heating step, the heating unit is moved such that the heat spots are positioned over an entirety of at least the second region.

In the heating step, the heating unit may preferably be moved, so that the heat spots move in a circle along the outer periphery of the wafer in the region to be heated and the heat spots reciprocally move in a radial direction of the wafer in the second region.

In the heating step, the heating unit may preferably be moved such that the heat spots move in concentric circles in the region to be heated, to heat the region to be heated of the sheet is heated over an entirety thereof.

The present invention brings about an advantageous effect that the sheet is allowed to shrink by heating after its expansion.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

With reference to the attached drawings, a description will hereinafter be made in detail about embodiments of the present invention and its modification. However, the present invention shall not be limited by details that will be described in the subsequent embodiment. The elements of configurations that will hereinafter be described include those readily conceivable to persons skilled in the art and substantially the same ones. Further, the configurations that will hereinafter be described can be combined appropriately. Furthermore, various omissions, replacements and modifications of configurations can be made without departing from the spirit of the present invention.

First Embodiment

Figure 1:
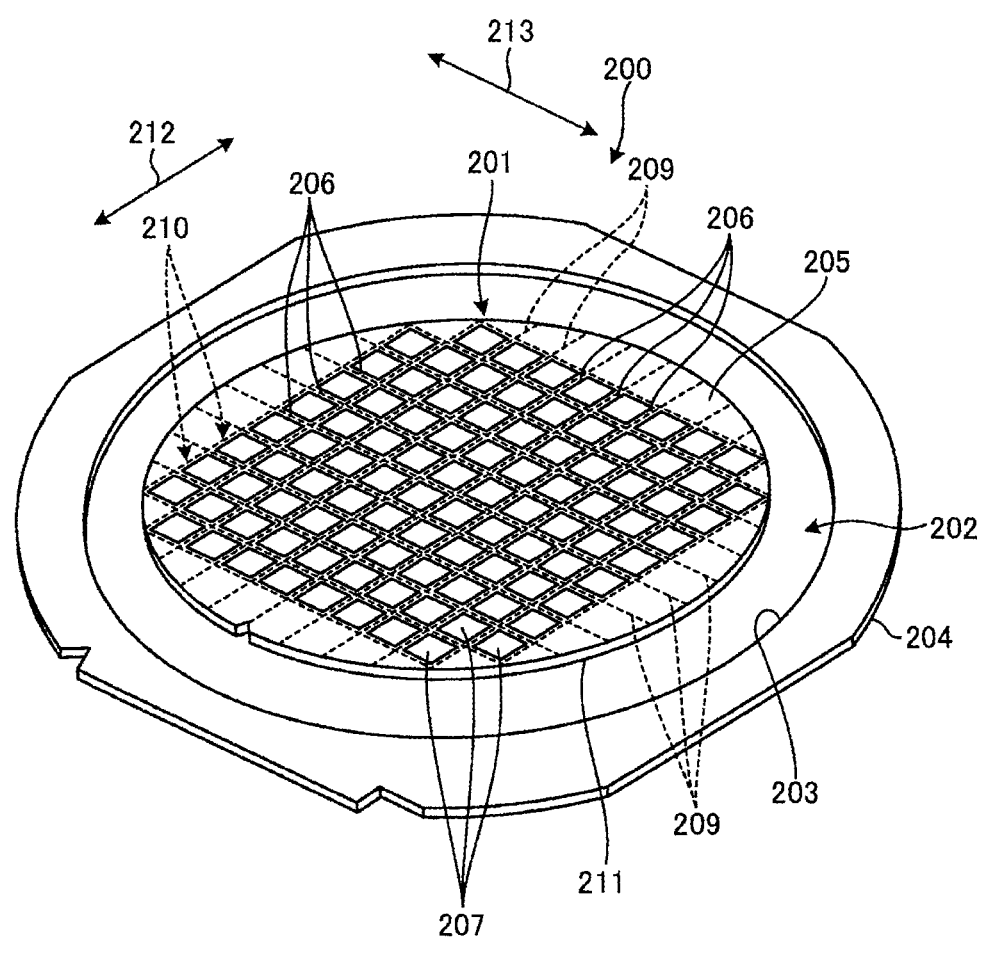
FIG. 1 is a perspective view depicting a configuration example of a wafer unit including a sheet to be expanded by an expansion method according to a first embodiment of the present invention.
Figure 2:
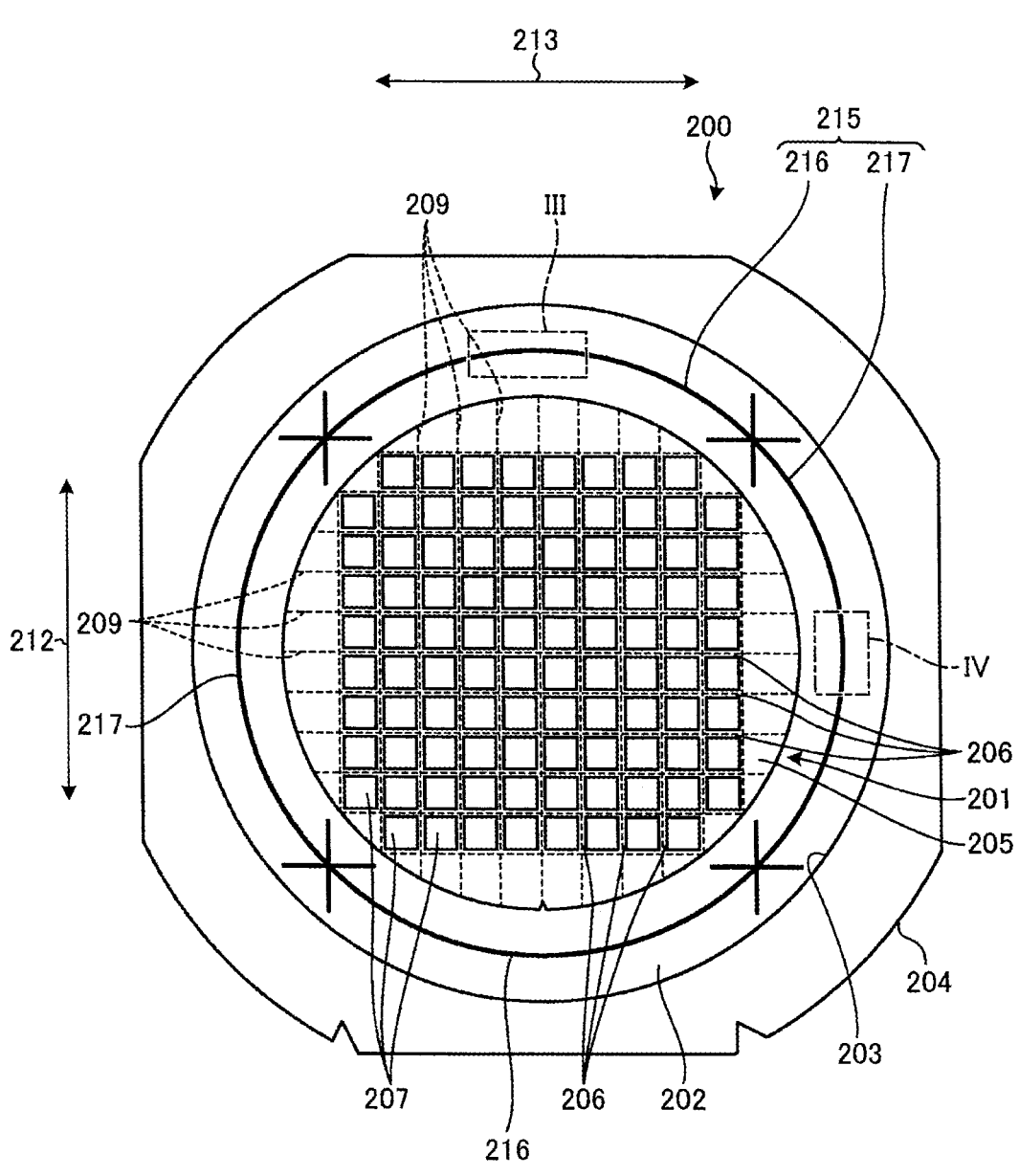
FIG. 2 is a plan view of the wafer unit depicted in FIG. 1.
Figure 3:
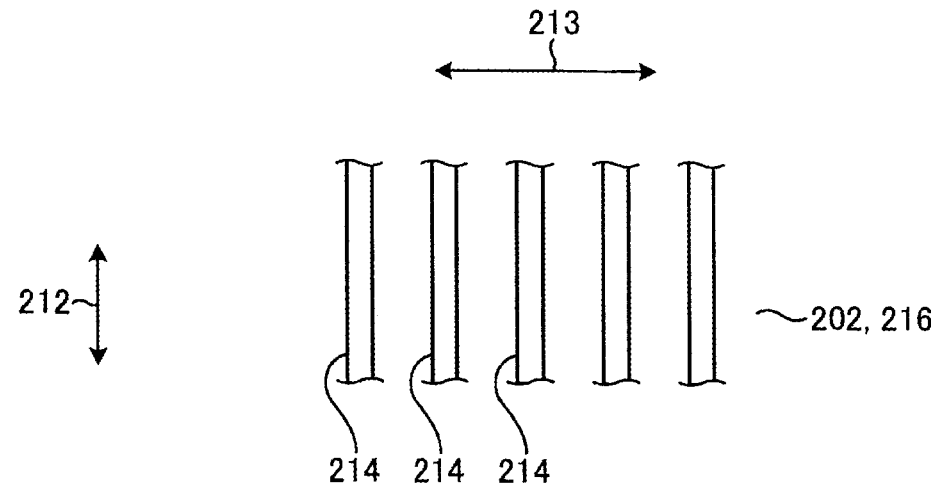
FIG. 3 is a view schematically depicting molecular chains in a portion III of the sheet in FIG. 2.
Figure 4:
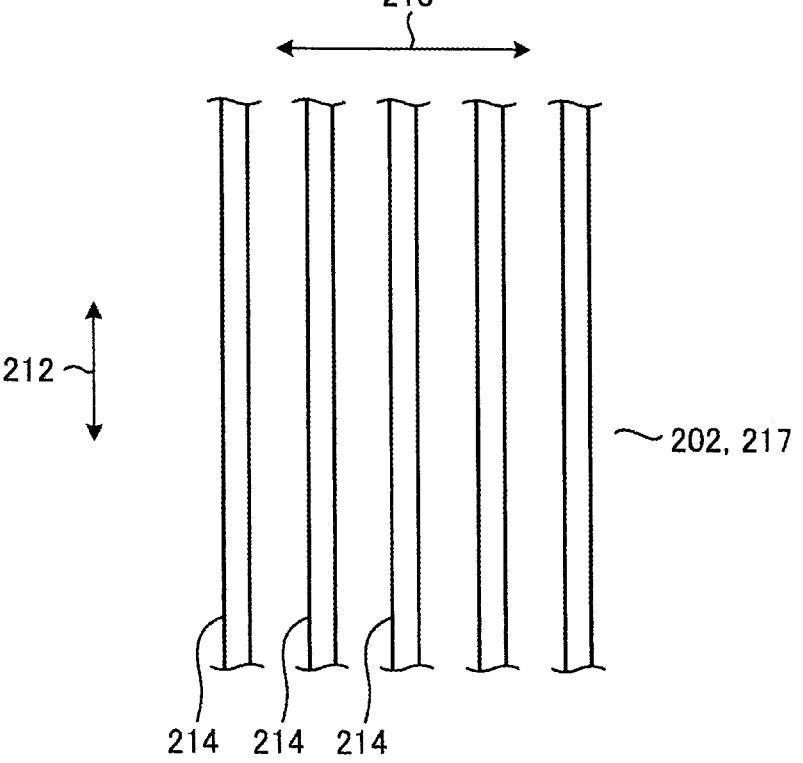
FIG. 4 is a view schematically depicting molecular chains in a portion IV of the sheet in FIG. 2.

An expansion method according to a first embodiment of the present invention will be described based on FIGS. 1 through 17. FIG. 1 is a perspective view depicting a configuration example of a wafer unit 200 including a sheet 202 to be expanded by the expansion method according to the first embodiment. FIG. 2 is a plan view of the wafer unit 200 depicted in FIG. 1. FIG. 3 is a view schematically depicting molecular chains 214 in a portion III of the sheet 202 in FIG. 2. FIG. 4 is a view schematically depicting molecular chains 214 in a portion IV of the sheet 202 in FIG. 2.
(Wafer Unit)

The expansion method according to the first embodiment is a method for expanding the sheet 202 of the wafer unit 200 depicted in FIG. 1. As depicted in FIG. 1, the wafer unit 200 includes a wafer 201, the sheet 202 with the wafer 201 bonded thereto, and an annular frame 204 carrying the sheet 202, which is bonded at an outer peripheral edge thereof to the annular frame 204, and having an opening 203 with the wafer 201 accommodated therein.

In the first embodiment, the wafer 201 is a disk-shaped semiconductor wafer, an optical device wafer, or the like, in which silicon, sapphire, gallium arsenide, silicon carbide (SiC), or the like is used as a substrate. In the wafer 201, devices 207 are formed in respective regions of a front surface 205 which are defined by a plurality of intersecting scribe lines 206.

The devices 207 are, for example, integrated circuits such as ordinary integrated circuits (ICs) or large scale integrations (LSIs), image sensors such as charge coupled devices (CCDs) or complementary metal oxide semiconductors (CMOS), or micro electro mechanical systems (MEMS), memories (semiconductor storage devices), or the like.

The wafer 201 includes modified layers 209 indicated by dotted lines in FIG. 1, and formed as division starting points along the scribe lines 206 inside the substrate by irradiating a laser beam of a wavelength, which has transmissivity for the substrate, along the scribe lines 206 from a side of a back surface 211 on a side opposite to the front surface 205. Using the modified layers 209 as start points, the wafer 201 is divided into individual chips 210. It is to be noted that each chip 210 includes a portion of the substrate divided along the scribe lines 206, and one of the devices 207 formed on a front surface of the substrate.

It is to be noted that the modified layers 209 mean regions which are different in density, refractive index, mechanism strength and/or other physical characteristics from surrounding regions. As the modified layers 209, fusion treatment regions, cracked regions, dielectric breakdown regions, refractive index change regions, regions where two or more kinds of such regions exist in combination, or the like can be exemplified. The modified layers 209 have lower mechanical strength than the remaining portions of the substrate.

The sheet 202 is made from a resin having stretchability, and shrinks when heated, in other words, has heat shrinkability. The sheet 202 is formed in a disk shape having a diameter greater than that of the wafer 201, and in the first embodiment, includes a base material layer made from a synthetic resin having stretchability and heat shrinkability, and an adhesive layer stacked on the base material layer, bonded to the wafer 201, and made from a synthetic resin having stretchability and heat shrinkability. The annular frame 204 is bonded to the outer peripheral edge of the sheet 202, and the wafer 201 is bonded at the back surface 211 thereof to a central portion of the sheet 202. It is to be noted that the sheet 202 may be formed of only a base material layer made from a polyolefin which is a thermoplastic resin, and may not include an adhesive layer having tackiness.

The sheet 202 has stretchability, and is formed, for example, by stretching a heated synthetic resin in a second direction 213 while being drawn along a first direction 212 orthogonal to the second direction 213. In the first embodiment, the first direction 212 is a generally-called flow direction (machine direction (MD)), and the second direction 213 is a generally-called perpendicular direction (transverse direction (TD)). In the first embodiment, the sheet 202 contains the molecular chains 214 extending in the first direction 212 as depicted in FIGS. 3 and 4.

In the first embodiment, the sheet 202 contains the molecular chains 214 extending in the first direction 212, and when heated, is therefore harder to shrink in the second direction 213 than in the first direction 212. In other words, the sheet 202 has a smaller shrinkage in the second direction 213 that in the first direction 212 when heated. As appreciated from the foregoing, the sheet 202 includes, in a region 215 between an inner periphery of the annular frame 204 and an outer periphery of the wafer 201, the region 215 being presented in FIGS. 1 and 2 and corresponding to the region to be heated, first regions 216 that are located at opposite end portions in the first direction 212 of the sheet 202, and second regions 217 that are located at opposite end portions in the second direction 213 of the sheet 202 and are harder to shrink by heating than the first regions 216.

It is to be noted that boundaries between the first regions 216 and the second regions 217 are indicated by radial phantoms in FIG. 2 but in reality, no boundaries are formed dividing the first regions 216 and the second regions 217 from each other in the sheet 202. In the example depicted in FIG. 2, the first regions 216 and the second regions 217 are alternately arranged every 90 degrees around a center of the sheet 202. In the present invention, however, the arrangement of the first regions 216 and the second regions 217 is not limited to the one depicted in FIG. 2, and may desirably be determined as appropriate according to the kind of the sheet 202 and the size of the chips 210 insofar as the first regions 216 are located at the opposite end portions in the first direction 212 of the sheet 202 and the second regions 217 are located at the opposite end portions in the second direction 213 of the sheet 202.

The annular frame 204 is formed in an annular shape of an inner diameter greater than the diameter of the wafer 201, and carries the sheet 202 bonded at the outer peripheral edge thereof to the annular frame 204.

The wafer unit 200 of the above-mentioned configuration is obtained, for example, by bonding the wafer 201 at the back surface 211 thereof to the sheet 202, and bonding the annular frame 204 to the outer peripheral edge of the sheet 202.

(Expanding Machine)

Figure 5:
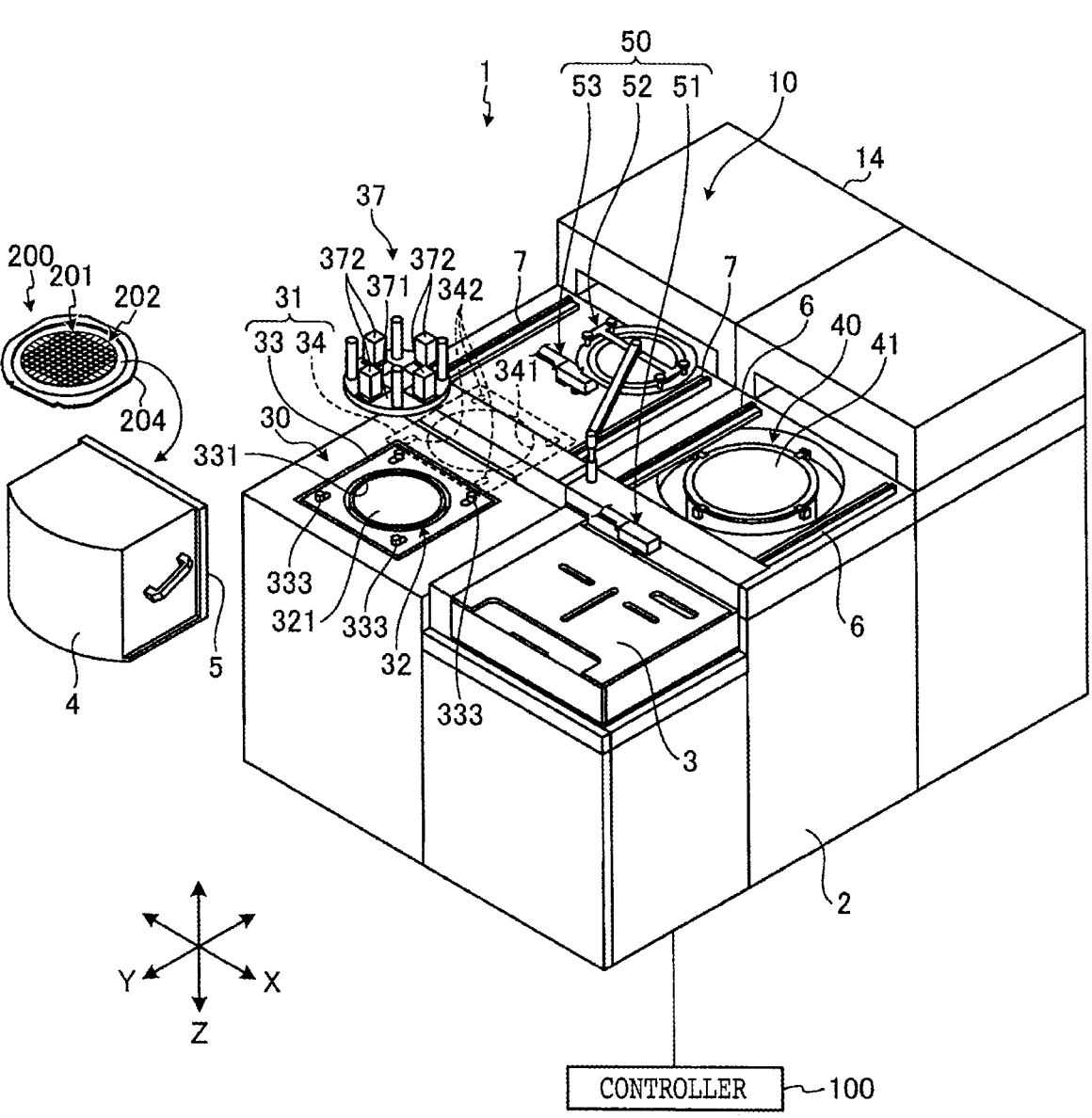
FIG. 5 is a perspective view depicting a configuration example of an expanding machine that performs the expansion method according to the first embodiment.
Figure 6:
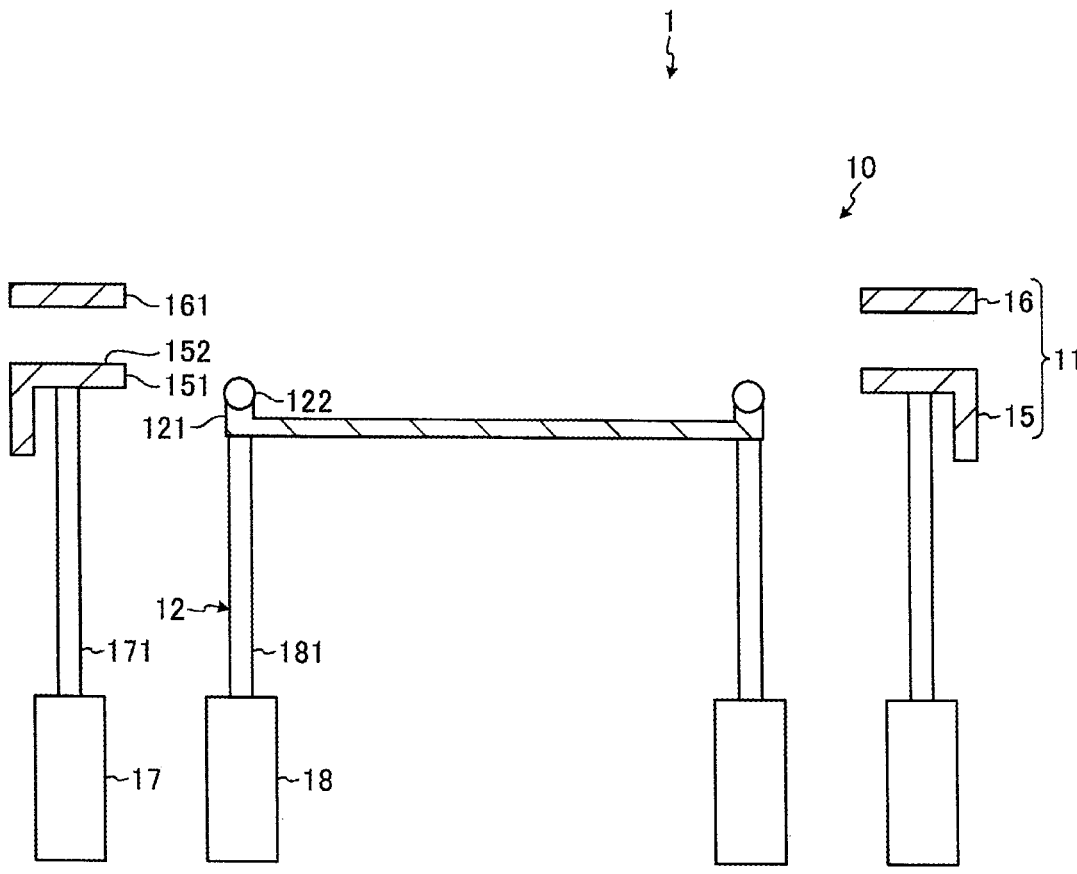
FIG. 6 is a cross-sectional view schematically depicting a configuration example of a dividing unit of the expanding machine depicted in FIG. 5.
Figure 7:
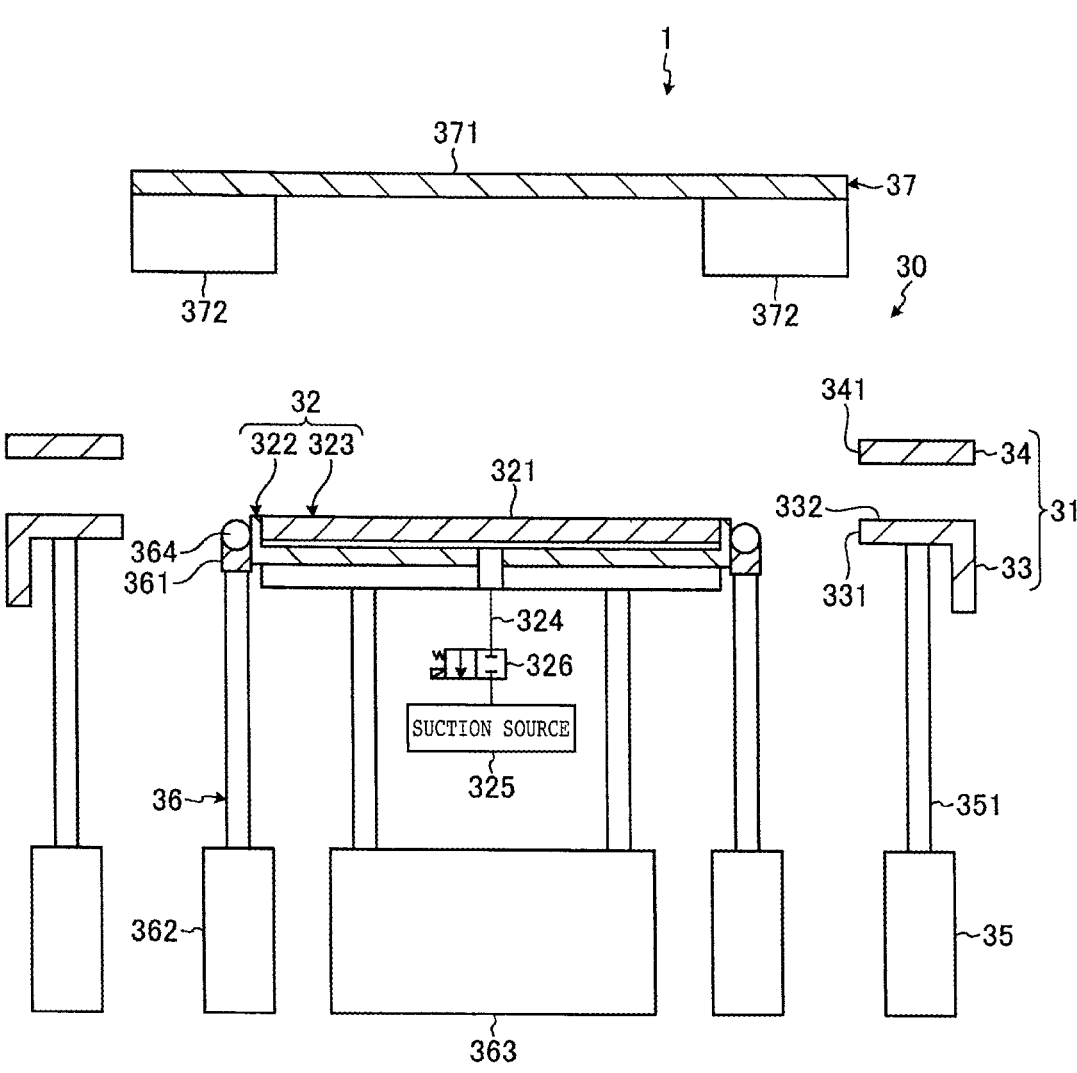
FIG. 7 is a cross-sectional view schematically depicting a configuration example of a heating unit of the expanding machine depicted in FIG. 5.
Figure 8:
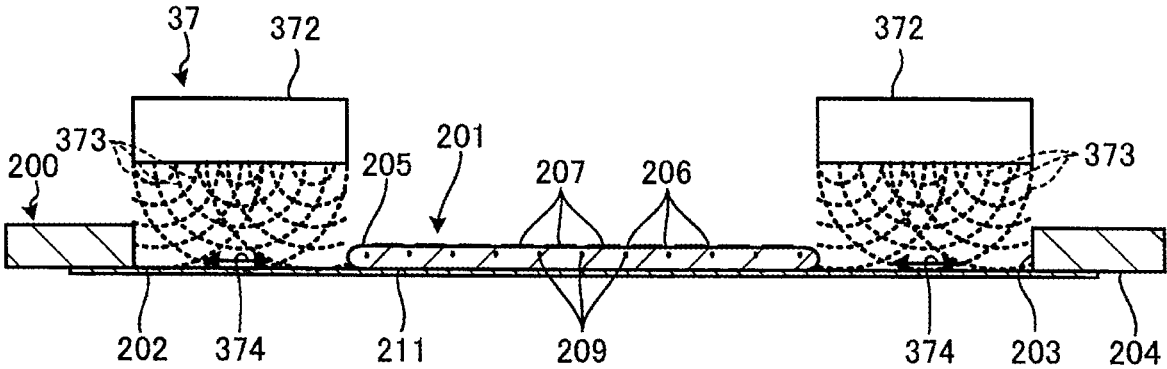
FIG. 8 is a side view schematically depicting a positional relation between a plurality of heating elements of a heating assembly of the heating unit depicted in FIG. 7 and the wafer unit.

A description will be made of an expanding machine 1 that performs the expansion method according to the first embodiment. FIG. 5 is a perspective view depicting a configuration example of the expanding machine 1 that performs the expansion method according to the first embodiment. FIG. 6 is a cross-sectional view schematically depicting a configuration example of a dividing unit 10 of the expanding machine 1 depicted in FIG. 5. FIG. 7 is a cross-sectional view schematically depicting a configuration example of a heating unit 30 of the expanding machine 1 depicted in FIG. 5. FIG. 8 is a side view schematically depicting a positional relation between a plurality of heating elements 372 of a heating assembly 37 of the heating unit 30 depicted in FIG. 7 and the wafer unit 200.

The expanding machine 1 depicted in FIG. 5 expands the sheet 202 of the wafer unit 200, and divides the wafer 201, in which the modified layers 209 have been formed as division starting points, into the individual chips 210 along the scribe lines 206. As depicted in FIG. 5, the expanding machine 1 includes a cassette elevator 3 disposed on a machine main body 2, the dividing unit 10, the heating unit 30, a rinsing unit 40, a transfer unit 50, and a controller 100 as control means.

The cassette elevator 3 is arranged on one end in a Y-axis direction, which is parallel to a horizontal direction, of the machine main body 2, and a cassette 4 with a plurality of wafer units 200 contained therein is detachably mounted on the cassette elevator 3. The cassette 4 contains the wafer units 200 at intervals in a Z-axis direction parallel to a vertical direction. The cassette 4 is mounted on the cassette elevator 3 with an opening 5, through which the wafer units 200 can be taken out of or into the cassette 4, directed toward a central portion in the Y-axis direction of the machine main body 2. The cassette elevator 3 lifts up or down the cassette 4 in the Z-axis direction.

The expanding machine 1 also includes a pair of first guide rails 6 and a pair of second guide rails 7. On the paired first guide rails 6, the wafer unit 200 that has been taken out of or is to be taken into the cassette 4 is temporarily placed. On the paired second guide rails 7, the wafer unit 200 that has been transferred from the first guide rails 6 by the transfer unit 50 is temporarily placed. The paired first guide rails 6 are parallel to the Y-axis direction, and are arranged with an interval therebetween in the X-axis direction that is parallel to the horizontal direction and is orthogonal to the Y-axis direction. The paired first guide rails 6 are arranged centrally in the Y-axis direction on the machine main body 2 so that they align in the Y-axis direction with opposite ends in the X-axis direction of the opening 5 of the cassette 4 mounted on the cassette elevator 3. The paired first guide rails 6 are disposed movably in the X-axis direction by a drive mechanism (not depicted) and are moved toward and away from each other by the drive mechanism. When the wafer unit 200 that has been taken out of or is to be taken into the cassette 4 is mounted on the paired first guide rails 6 and the paired first guide rails 6 are moved toward each other by the drive mechanism, the paired first guide rails 6 position the wafer unit 200 in the X-axis direction.

The paired second guide rails 7 are parallel to the Y-axis direction, are parallel to the horizontal direction, and are arranged with an interval therebetween in the X-axis direction. The paired second guide rails 7 are arranged centrally in the Y-axis direction on the machine main body 2, and are arranged in the X-axis direction adjacent the first guide rails 6. The paired second guide rails 7 are disposed movably in the X-axis direction by a drive mechanism (not depicted), and are moved toward and away from each other by the drive mechanism. When the wafer unit 200 transferred from the first guide rails 6 is mounted on the paired second guide rails 7 and the paired second guide rails 7 are moved toward each other by the drive mechanism, the paired second guide rails 7 position the wafer unit 200 in the X-axis direction.

The transfer unit 50 includes a first transfer unit 51, a second transfer unit 52, and a third transfer unit 53. The first transfer unit 51 transfers the wafer unit 200 between the cassette 4 and on the first guide rails 6. The second transfer unit 52 transfers the wafer unit 200 between the first guide rails 6 and the second guide rails 7, between the second guide rails 7 and the heating unit 30, between the heating unit 30 and the rinsing unit 40, and between the rinsing unit 40 and on the first guide rails 6. The third transfer unit 53 transfers the wafer unit 200 between the second guide rails 7 and the dividing unit 10.

The dividing unit 10 is arranged adjacent one sides in the Y-axis direction of the paired second guide rails 7. As depicted in FIG. 6, the dividing unit 10 includes a frame fixing unit 11, and a pressing unit 12. The frame fixing unit 11 and the pressing unit 12 are accommodated in a cooling chamber 14 (depicted in FIG. 1), which is arranged adjacent the one sides in the Y-axis direction of the paired second guide rails 7 in the machine main body 2, and is cooled on an inner side thereof.

The frame fixing unit 11 serves to fix the annular frame 204 of the wafer unit 200, and includes a frame mount plate 15 and a frame holding plate 16. The frame mount plate 15 is provided with an opening 151 having a circular shape as seen in plan, and is formed in a plate shape with an upper surface 152 thereof formed to be parallel to the horizontal direction and to be planar. The opening 151 of the frame mount plate 15 has an inner diameter formed slightly smaller than the inner diameter of the annular frame 204 and greater than the diameter of the wafer 201. With the wafer 201 positioned above the opening 151, the annular frame 204 of the wafer unit 200 is mounted on the upper surface 152 of the frame mount plate 15.

In the first embodiment, the frame mount plate 15 is raised in the Z-axis direction by cylinders 17 from a position where the upper surface 152 lies on the same plane as the lower surface of the annular frame 204 of the wafer unit 200 positioned in the X-axis direction by the second guide rails 7. Described specifically, the frame mount plate 15 is attached to tips of extendable and retractable rods 171 of the cylinders 17, and therefore is disposed movably up and down in the Z-axis direction by extension and retraction of the rods 171 of the cylinders 17.

The frame holding plate 16 is fixed above the frame mount plate 15. The frame holding plate 16 is formed in a plate shape of substantially the same dimensions as the frame mount plate 15, and is centrally provided with a circular opening 161 of the same dimensions as the opening 151. The opening 161 of the frame holding plate 16 is arranged coaxially with the opening 151 of the frame mount plate 15.

After the rods 171 have been contracted, the wafer unit 200 is transferred by the third transfer unit 53 onto the upper surface 152 of the frame mount plate 15 positioned at a height so lowered. After the annular frame 204 of the wafer unit 200 has been mounted on the upper surface 152 of the frame mount plate 15, the rods 171 of the cylinders 17 are extended to raise the frame mount plate 15. The frame fixing unit 11 holds and fixes the annular frame 204 of the wafer unit 200 between the frame holding plate 16 and the frame mount plate 15 so raised.

The pressing unit 12 serves to press the sheet 202 of the wafer unit 200, which includes the annular frame 204 fixed by the frame fixing unit 11, in the region 215 between the inner periphery of the annular frame 204 and the outer periphery of the wafer 201. The pressing unit 12 includes an expansion drum 121, and a plurality of rollers 122.

In the first embodiment, the expansion drum 121 is formed in a cylindrical shape closed at a lower part thereof, has a diameter formed smaller than the inner diameter of the annular frame 204 to be mounted on the upper surface 152 of the frame mount plate 15, and has an inner diameter formed greater than the diameter of the wafer 201 bonded to the sheet 202. The expansion drum 121 is arranged coaxially with the openings 151 and 161 of the frame fixing unit 11.

The rollers 122 are each formed in a cylindrical shape, and are each supported rotatably about an axis of rotation (hereinafter referred to as "rotation axis") on an upper end of the expansion drum 121. The rollers 122 are arranged at equal intervals in a peripheral direction. As the rollers 122 are arranged at equal intervals on the upper end of the expansion drum 121, they are arranged in a circle surrounding the wafer 201 as seen in plan.

The rollers 122 are each arranged with the rotation axis thereof extending in parallel with a tangent to the expansion drum 121 as seen in plan. On the upper end of the expansion drum 121, the rollers 122 are each supported rotatably about the rotation axis thereof extending in parallel with the tangent to the expansion drum 121 as seen in plan, and therefore are each arranged in a direction that the rollers 122 are allowed to rotate in a radial direction of the wafer 201.

The expansion drum 121 is connected to cylinders 18 via extendable and retractable rods 181, and is raised and lowered in the Z-axis direction by the cylinders 18. Described specifically, the expansion drum 121 is attached to tips of the rods 181 of the cylinders 18 and is disposed movably up and down in the Z-axis direction by extension and retraction of the rods 181 of the cylinders 18.

In the first embodiment, the expansion drum 121 is raised and lowered in the Z-axis direction by the cylinders 18 between a position, where upper ends of the rollers 122 are located on a lower side of the upper surface 152 of the frame mount plate 15 of the frame fixing unit 11 by which the annular frame 204 is fixed, and another position, where the upper ends of the rollers 122 are located on an upper side of the upper surface 152 of the frame mount plate 15 of the frame fixing unit 11 by which the annular frame 204 is fixed.

When the expansion drum 121 is raised by the cylinders 18, the upper ends of the rollers 122 are positioned on the upper side of the upper surface 152 of the frame mount plate 15 of the frame fixing unit 11 by which the annular frame 204 is fixed. The rollers 122 hence press the region 215 of the sheet 202 between the inner periphery of the annular frame 204 fixed by the frame fixing unit 11 and the outer periphery of the wafer 201.

The dividing unit 10 expands the sheet 202 in the direction of its plane by fixing the annular frame 204 of the wafer unit 200 with the frame fixing unit 11, raising the expansion drum 121 from the position where the upper ends of the rollers 122 are located on the lower side of the upper surface 152 of the frame mount plate 15 of the frame fixing unit 11 by which the annular frame 204 is fixed, and pressing the region 215 of the sheet 202 between the inner periphery of the annular frame 204 and the outer periphery of the wafer 201. After the sheet 202 has been expanded once as described above, the dividing unit 10 then lowers the expansion drum 121, whereby slack is formed in the region 215 of the sheet 202 between the inner periphery of the annular frame 204 of the wafer unit 200 and the outer periphery of the wafer 201.

The heating unit 30 is arranged adjacent the other sides in the Y-axis direction of the paired second guide rails 7. As depicted in FIG. 7, the heating unit 30 includes a holding table 32, a frame fixing unit 31, a sheet expansion unit 36, and the heating assembly 37.

The holding table 32 has a holding surface 321 that holds by suction the wafer 201 of the wafer unit 200 via the sheet 202. The holding table 32 is in a disk shape having a diameter smaller than the inner diameter of the annular frame 204 and includes a disk-shaped frame body 322 made from a metal such as stainless steel, and a disk-shaped suction portion 323 made of a porous material such as porous ceramics and surrounded by the frame body 322.

Upper surfaces of the frame body 322 and suction portion 323 are arranged on the same plane, and make up the holding surface 321 that holds the wafer 201 by suction. The suction portion 323 has substantially the same diameter as the wafer 201. The suction portion 323 is connected to a suction source 325 such as an ejector via a suction channel 324 formed in the frame body 322 and the like. The suction channel 324 is provided with an on-off valve 326.

Via the sheet 202 of the wafer unit 200 transferred onto the holding surface 321 by the second transfer unit 52, the wafer 201 is mounted on the side of the back surface 211 thereof on the holding table 32. By opening the on-off valve 326, air is drawn by the suction source 325 from the suction portion 323 of the holding surface 321, whereby the wafer 201 is held on the side of the back surface 211 thereof by suction on the holding surface 321.

The frame fixing unit 31 serves to fix the annular frame 204 of the wafer unit 200. The frame fixing unit 31 includes a frame mount plate 33, and a frame holding plate 34. The frame mount plate 33 is provided with an opening 331 having a circular shape as seen in plan, and is formed in the shape of a plate with an upper surface 332 thereof formed to be parallel with the horizontal direction and to be planar. The opening 331 of the frame mount plate 33 has an inner diameter formed slightly smaller than the inner diameter of the annular frame 204 and greater than the diameter of the wafer 201. The frame mount plate 33 is arranged, so that the holding table 32 is located in the opening 331 and the opening 331 is coaxial with the holding table 32. As depicted in FIG. 5, the frame mount plate 33 is provided in four corners of the upper surface 332 thereof with centering guides 333 disposed movably in the horizontal direction. The centering guides 333 are moved in the horizontal direction to adjust the position of the annular frame 204, thereby positioning the wafer 201 at a position where the wafer 201 is coaxial with the suction portion 323 of the holding surface 321 of the holding table 32.

Further, the frame mount plate 33 is disposed movably up and down in the Z-axis direction by cylinders 35. Described specifically, the frame mount plate 33 is attached to tips of extendable and retractable rods 351 of the cylinders 35, and therefore is disposed movably up and down in the Z-axis direction by extension and retraction of the rods 351 of the cylinders 35.

The frame holding plate 34 is formed in the shape of a plate of substantially the same dimensions as the frame mount plate 33, and is centrally provided with a circular opening 341 of the same dimensions as the opening 331. The frame holding plate 34 is attached to tips of piston rods of cylinders (not depicted), and is movable between a position above the frame mount plate 33 and another position set back from the position above the frame mount plate 33 by extension and retraction of the piston rods in the Y-axis direction. As depicted in FIG. 5, the frame holding plate 34 is provided in four corners thereof with slots 342 into which the centering guides 333 can enter.

With the frame holding plate 34 positioned at the position set back from the position above the frame mount plate 33 and the centering guides 333 kept apart from each other in the frame fixing unit 31, the wafer unit 200 is transferred to the frame fixing unit 31 by the second transfer unit 52, and the annular frame 204 of the wafer unit 200 is mounted by the second transfer unit 52 onto the upper surface 332 of the frame mount plate 33. The frame fixing unit 31 brings the centering guides 333 closer to each other to position the wafer 201 of the wafer unit 200. The frame fixing unit 31 positions the frame holding plate 34 above the frame mount plate 33, the frame mount plate 33 is raised by the cylinders 35, and the annular frame 204 of the wafer unit 200 is held and fixed between the frame mount plate 33 and the frame holding plate 34.

The sheet expansion unit 36 serves to relatively move the holding table 32 and the frame fixing unit 31 along their axes of rotation, which extend in the vertical direction, to positions where they are apart from each other, and to expand the sheet 202. As depicted in FIG. 7, the sheet expansion unit 36 includes a push-up member 361, push-up member lift units 362, and a holding table lift unit 363.

The push-up member 361 is formed in a cylindrical shape, has a diameter formed smaller than the inner diameter of the annular frame 204 to be mounted on the upper surface 332 of the frame mount plate 33, and has an inner diameter formed greater than the diameter of the holding table 32. The push-up member 361 is arranged coaxially with the holding table 32, with the holding table 32 located inside the push-up member 361. To an upper end of the push-up member 361, rollers 364 are rotatably attached.

The push-up member lift unit 362 serves to raise and lower the push-up member 361 in the Z-axis direction between a position, where the rollers 364 are located below the upper surface 332 of the lowered frame mount plate 33, and another position, where the rollers 364 are located above the upper surface 332 of the raised frame mount plate 33.

The holding table lift unit 363 serves to raise and lower the holding table 32 in the Z-axis direction between a position, where the holding surface 321 is located below the upper surface 332 of the lowered frame mount plate 33, and another position, where the holding surface 321 is located above the upper surface 332 of the raised frame mount plate 33.

The heating assembly 37 serves to heat and shrink the slack, which has been formed by expanding the sheet 202 with the dividing unit 10, in the region 215 of the sheet 202 between the annular frame 204 and the wafer 201. The heating assembly 37 includes a disk portion 371 and heating elements 372. The disk portion 371 is movable in the Z-axis direction and rotates about an axis of rotation that is parallel to the Z-axis direction.

Above the region 215 of the sheet 202 of the wafer unit 200 including the annular frame 204 fixed by the frame fixing unit 31, the heating elements 372 are disposed on the disk portion 371 at equal intervals in a peripheral direction, and are arranged in a circle corresponding to the region 215 of the sheet 202. On the disk portion 371, the heating elements 372 are arranged at positions facing the region 215 of the sheet 202 of the wafer unit 200, which is held by the holding table 32 and the frame fixing unit 31, in the Z-axis direction. In the first embodiment, four heating elements 372 are disposed at equal interval in a peripheral direction, although not limited to four in the present invention.

The heating elements 372 are of a type that downwardly radiates infrared rays 373 (see FIG. 8) as heat to heat the region 215 of the sheet 202, for example, are infrared ceramic heaters that are heated to radiate the infrared rays 373 when a voltage is applied. The disk portion 371 is rotated about the axis of rotation that is coaxial with an axis of rotation of the holding table 32, so that the heating elements 372 are allowed to circle over the above-mentioned region 215 of the sheet 202. The heating elements 372 are disposed on the disk portion 371 movably by a drive unit (not depicted) in a radial direction of the sheet 202 of the wafer unit 200 held by the frame fixing unit 31.

By lowering the disk portion 371 to make the heating elements 372 face in the vertical direction the region 215 of the sheet 202 of the wafer unit 200 held by the holding table 32 and frame fixing unit 31, and rotating the disk portion 371 about the axis of rotation thereof to allow the heating elements 372 to circle over the above-mentioned region 215 of the sheet 202, the heating assembly 37 heats and shrinks the slack in the region 215 of the sheet 202.

As depicted in FIG. 8, the heating elements 372 of the heating assembly 37 form heat spots 374 of a temperature higher than that of their surrounding sheet 202 on the region 215 of the sheet 202 with the infrared rays 373 radiated as heat toward the sheet 202. As described above, the heat spots 374 of the temperature higher than their surrounding sheet 202 are formed in the region 215 of the sheet 202 with the infrared rays 373 radiated from the heating elements 372 of the heating assembly 37 to the sheet 202. It is to be noted that, in the first embodiment, the heat spots 374 are formed in the region 215 of the sheet 202 at positions opposite in the Z-axis direction to the centers of the heating elements 372 as seen in the radial direction of the sheet 202, in other words, right below the radial centers of the heating elements 372.

The rinsing unit 40 serves to rinse primarily the wafer 201 of the wafer unit 200 in which the sheet 202 has then been expanded by the dividing unit 10 and the slack has been heated and shrunk by the heating unit 30. The rinsing unit 40 includes a spinner table 41, and a rinse water supply nozzle (not depicted). The spinner table 41 is arranged below the paired first guide rails 6 and holds the wafer 201 by suction via the sheet 202 of the wafer unit 200. The rinse water supply nozzle supplies rinse water to the front surface 205 of the wafer 201 held by suction on the spinner table 41.

When the paired first guide rails 6 are moved apart from each other in the rinsing unit 40, the wafer unit 200 in which the slack has been heated and shrunk by the heating unit 30 is mounted on the spinner table 41 by the second transfer unit 52. The rinsing unit 40 rinses the wafer 201 by supplying rinse water from the rinse water supply nozzle to the front surface 205 of the wafer 201 while rotating the spinner table 41 about an axis of rotation that is parallel to the Z-axis direction.

The controller 100 controls the above-mentioned elements of the expanding machine 1 and allows the expanding machine 1 to perform expanding operation on the sheet 202 of the wafer unit 200. It is to be noted that the controller 100 is a computer including an arithmetic processing unit having a microprocessor such as a central processing unit (CPU), a storage device having a memory such as a read only memory (ROM) or a random access memory (RAM), and an I/O interface device. The arithmetic processing unit of the controller 100 performs arithmetic processing based on a computer program stored in the storage device, and outputs control signals for control of the expanding machine 1 to the above-mentioned elements of the expanding machine 1 via the I/O interface device.

The controller 100 is connected to a display unit (not depicted) that displays conditions, images, and the like of processing operation and is configured of a liquid crystal display device or the like, and an input unit (not depicted) that is used when an operator records information regarding processing details and the like. The input unit is configured by at least one of a touch panel disposed in the display unit, and an external input device such as a keyboard.

Figure 9:
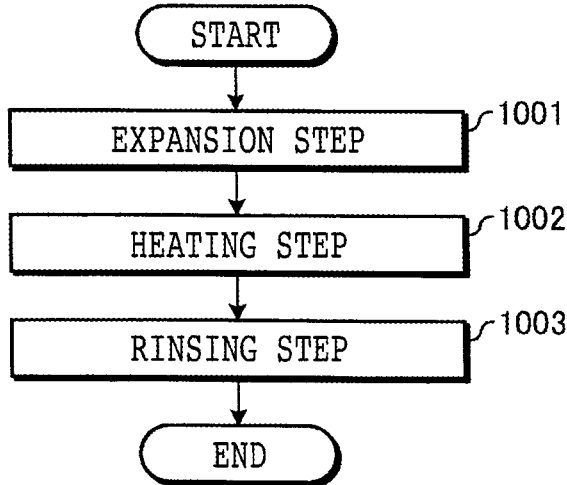
FIG. 9 is a flow chart depicting a flow of the expansion method according to the first embodiment.

A description will next be made of the expansion method according to the first embodiment. FIG. 9 is a flow chart depicting a flow of the expansion method according to the first embodiment.

The expansion method according to the first embodiment divides the wafer 201 into the individual chips 210 by expanding the sheet 202 of the wafer unit 200 and allowing the wafer 201 to fracture by using the modified layers 209 as start points. The expansion method includes, as depicted in FIG. 9, an expansion step 1001, a heating step 1002, and a rinsing step 1003.

(Expansion Step)

Figure 10:
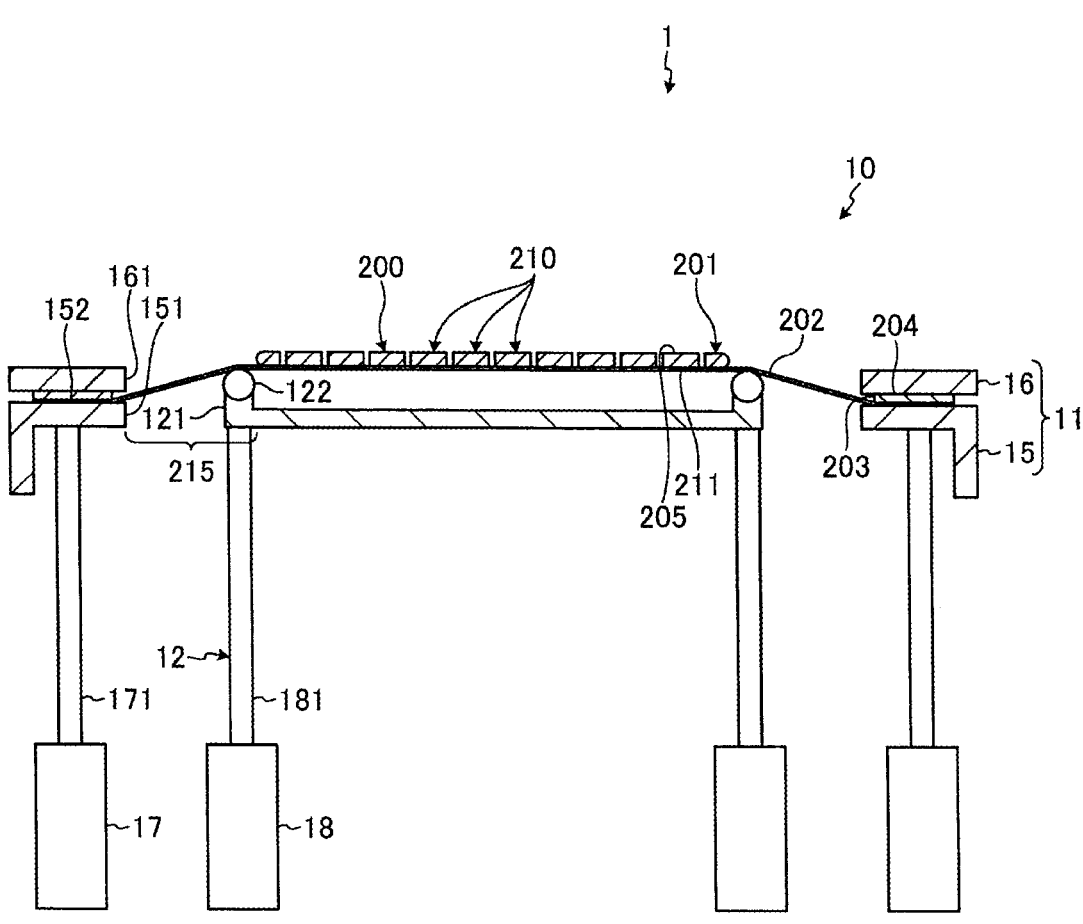
FIG. 10 is a cross-sectional view schematically depicting an expansion step of the expansion method depicted in FIG. 9.

FIG. 10 is a cross-sectional view schematically depicting the expansion step 1001 of the expansion method depicted in FIG. 9. In the expansion step 1001, the sheet 202 is expanded between the outer periphery of the wafer 201 and the inner periphery of the annular frame 204 of the wafer unit 200, whereby the wafer 201 is divided into the individual chips 210 by using the modified layers 209 as start points.

In the expansion step 1001, the wafer 201 is bonded at the back surface 211 thereof to the sheet 202, and the annular frame 204 is bonded to the outer peripheral edge of the sheet 202, so that the wafer unit 200 is constructed. In the expansion step 1001 of the first embodiment, the operator or the like inserts a plurality of wafer units 200 into the cassette 4 and mounts the cassette 4 with the wafer units 200 contained therein on the cassette elevator 3 of the expanding machine 1.

In the expansion step 1001 of the first embodiment, the controller 100 receives the information regarding the processing details via the input unit and stores it in the storage device. In the expansion step 1001 of the first embodiment, when the controller 100 receives a processing start instruction from the operator, the expanding machine 1, with the expansion drum 121 of the dividing unit 10 kept lowered, takes out one of the wafer units 200 from the cassette 4 by the first transfer unit 51, and after temporarily placing the wafer unit 200 on the paired first guide rails 6, brings the paired first guide rails 6 closer to each other to position the wafer unit 200 in the X-axis direction.

In the expansion step 1001, the expanding machine 1 transfers the wafer unit 200 from the first guide rails 6 onto the second guide rails 7 by the second transfer unit 52 and brings the paired second guide rails 7 closer to each other to position the wafer unit 200 in the X-axis direction. The expanding machine 1 then transfers by the third transfer unit 53 the wafer unit 200 from the paired second guide rails 7 onto the upper surface 152 of the lowered frame mount plate 15 of the dividing unit 10.

In the expansion step 1001, the expanding machine 1 raises the frame mount plate 15 of the dividing unit 10 and holds the annular frame 204 between the frame holding plate 16 and the frame mount plate 15 to fix the wafer unit 200.

In the expansion step 1001, the expanding machine 1 next raises the expansion drum 121 as depicted in FIG. 10. Then, the rollers 122 disposed on the upper end of the expansion drum 121 come into contact with the region 215 of the sheet 202, and the rollers 122 press the region 215 upward from below, so that the sheet 202 is expanded in the direction of its plane. As a result of the expansion of the sheet 202, a tensile force is radially applied to the sheet 202 in the expansion step 1001.

When the tensile force is radially applied to the sheet 202 bonded to the back surface 211 of the wafer 201 as described above, the wafer 201, because of the modified layers 209 formed beforehand along the scribe lines 206, is divided into the individual chips 210 along the scribe lines 206 by using the modified layers 209 as start points. Owing to the radial application of the tensile force to the wafer 201, the distance is also widened between the adjacent chips 210, so that space is formed between the adjacent chips 210.

In the expansion step 1001, the expanding machine 1 next lowers the expansion drum 121 of the dividing unit 10. Slack is then formed in the region 215 of the sheet 202 of the wafer unit 200, because the sheet 202 has been expanded once.

(Heating Step)

Figure 11:
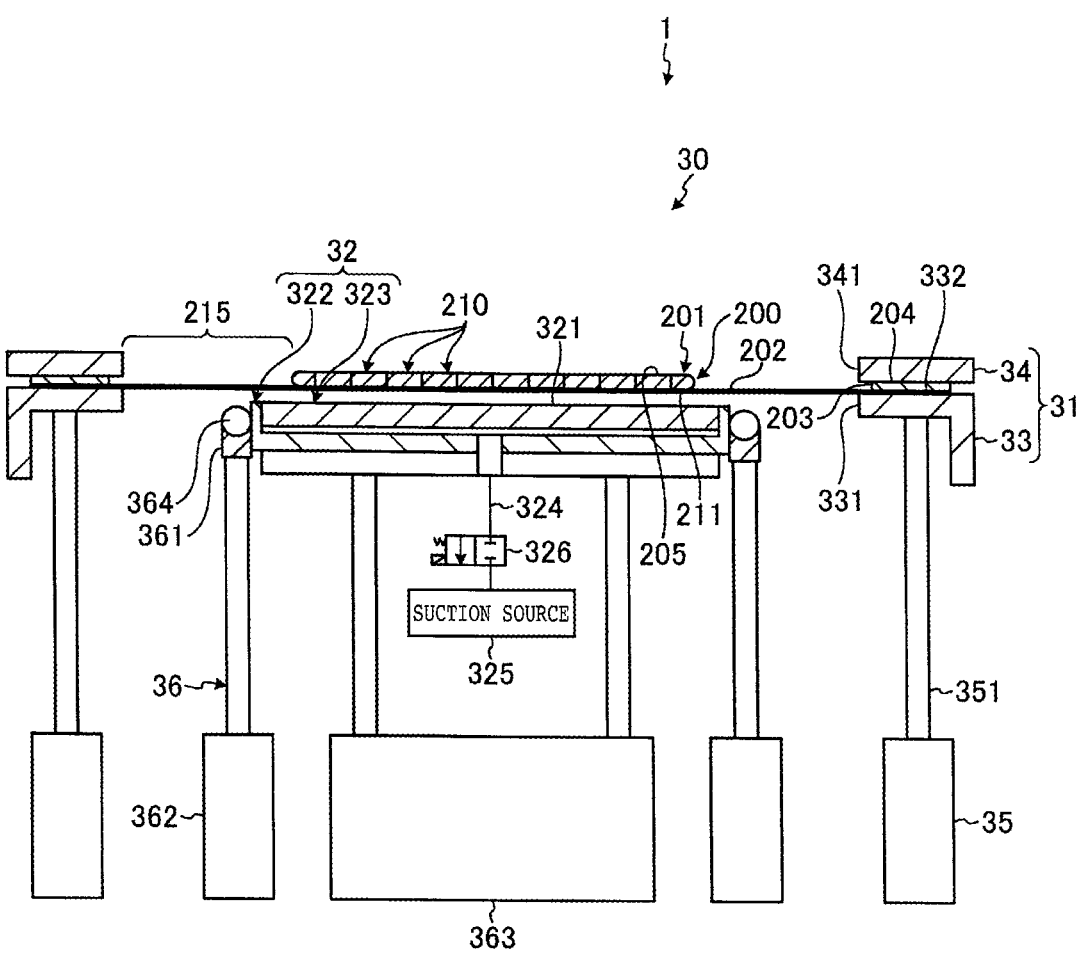
FIG. 11 is a cross-sectional view of an annular frame of the wafer unit as fixed by a frame fixing unit of the heating unit in the heating step of the expansion method depicted in FIG. 9.
Figure 12:
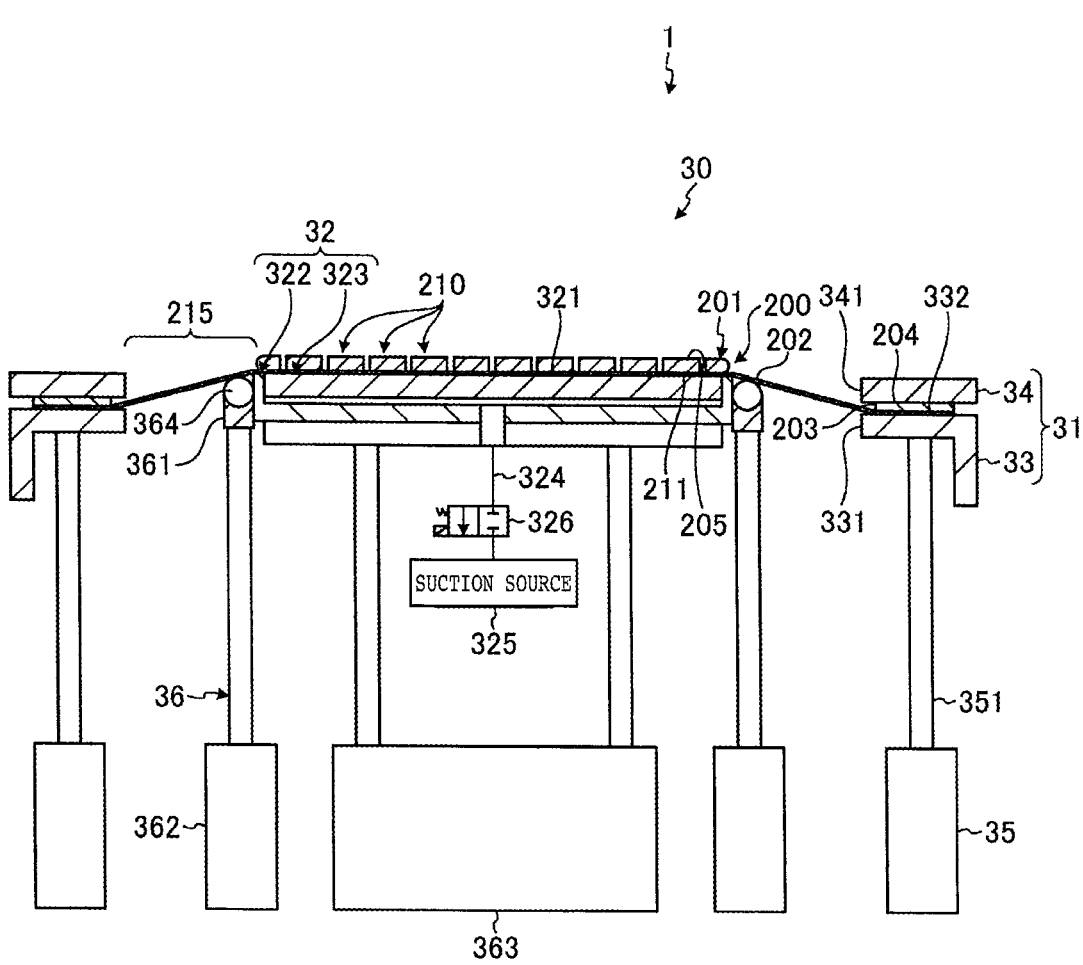
FIG. 12 is a cross-sectional view of the sheet expanded in the heating step of the expansion method depicted in FIG. 9.
Figure 13:
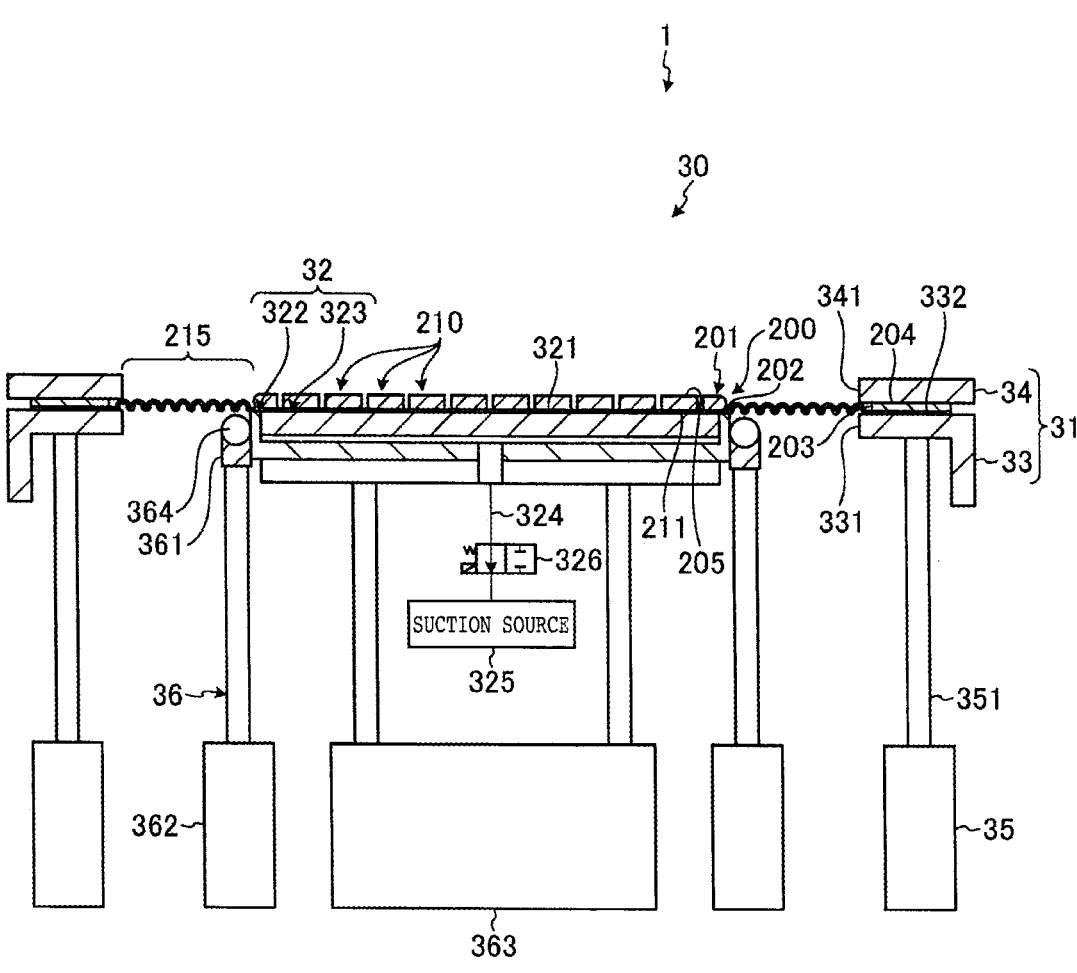
FIG. 13 is a cross-sectional view of the wafer unit held by suction on a holding table of the heating unit, and push-up members and the holding table lowered in the heating step of the expansion method depicted in FIG. 9.
Figure 14:
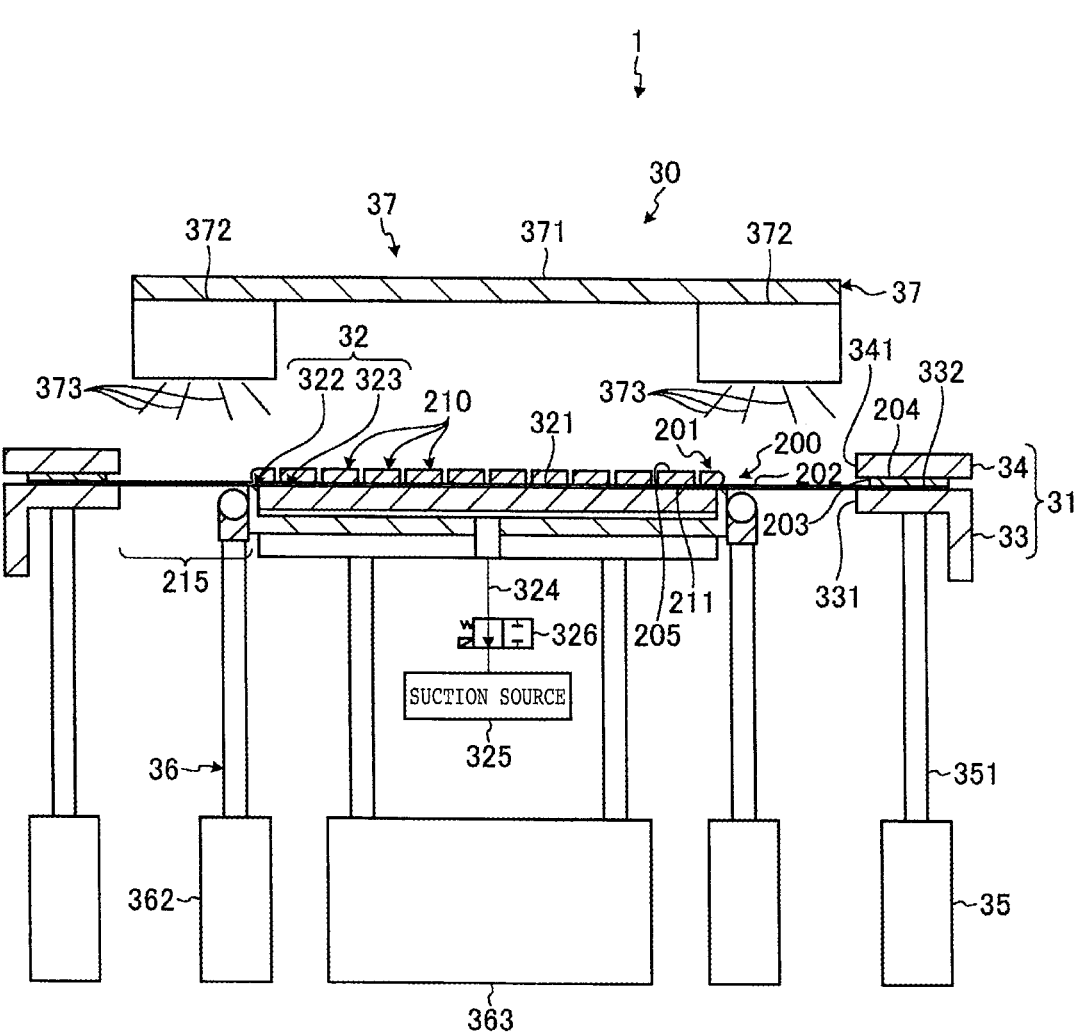
FIG. 14 is a cross-sectional view of slack in a region to be heated of the sheet as being heated in the heating step of the expansion method depicted in FIG. 9.
Figure 15:
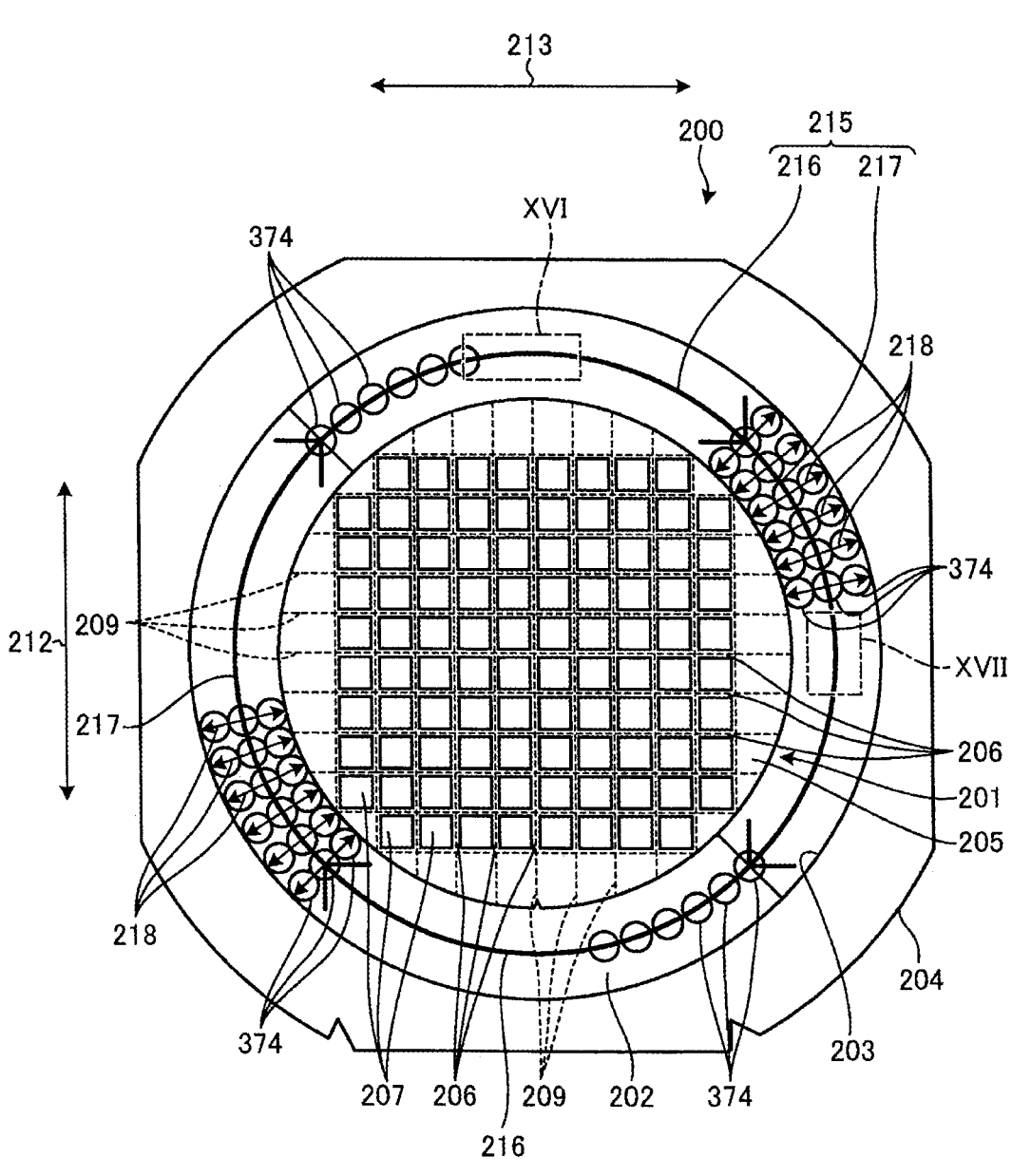
FIG. 15 is a plan view schematically depicting a moving path of the heating elements that heat the slack in the region to be heated of the sheet in the heating step of the expansion method depicted in FIG. 9.
Figure 16:
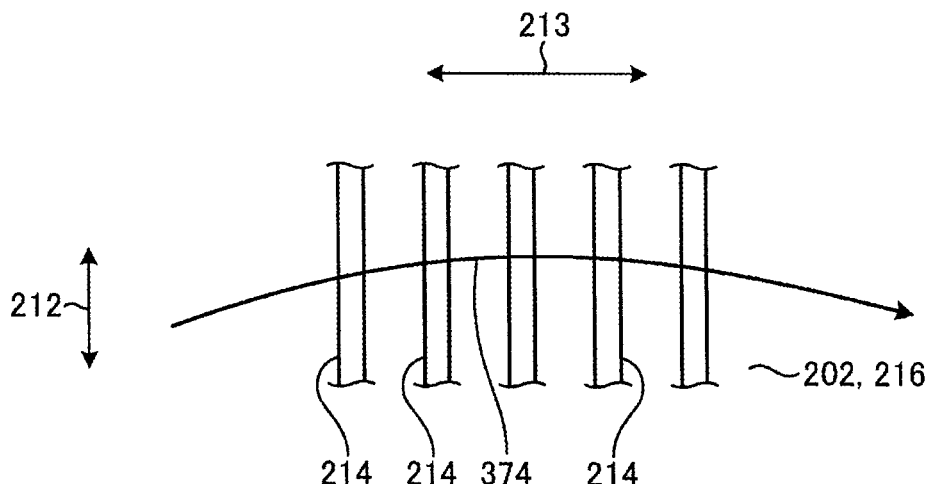
FIG. 16 is a plan view schematically depicting a moving path of heat spots across a portion XVI in FIG. 15.
Figure 17:
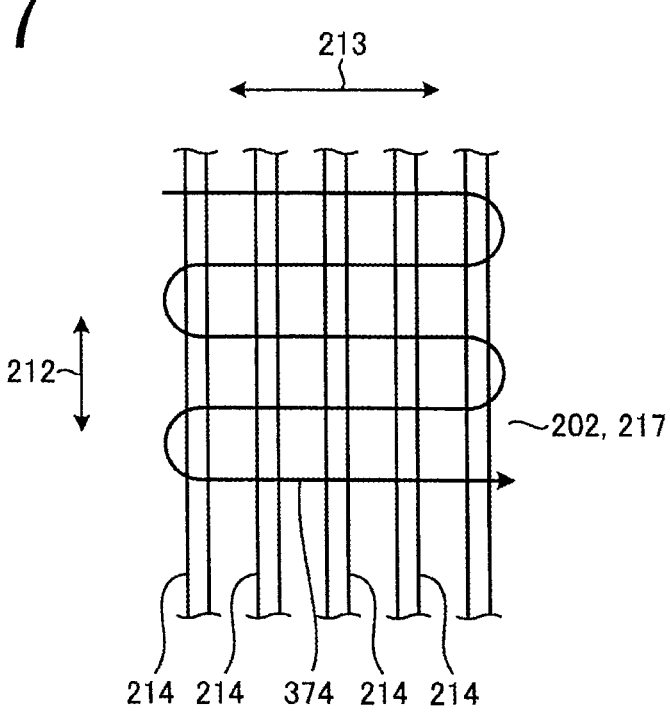
FIG. 17 is a plan view schematically depicting a moving path of heat spots across a portion XVII in FIG. 15.
Figure 18:
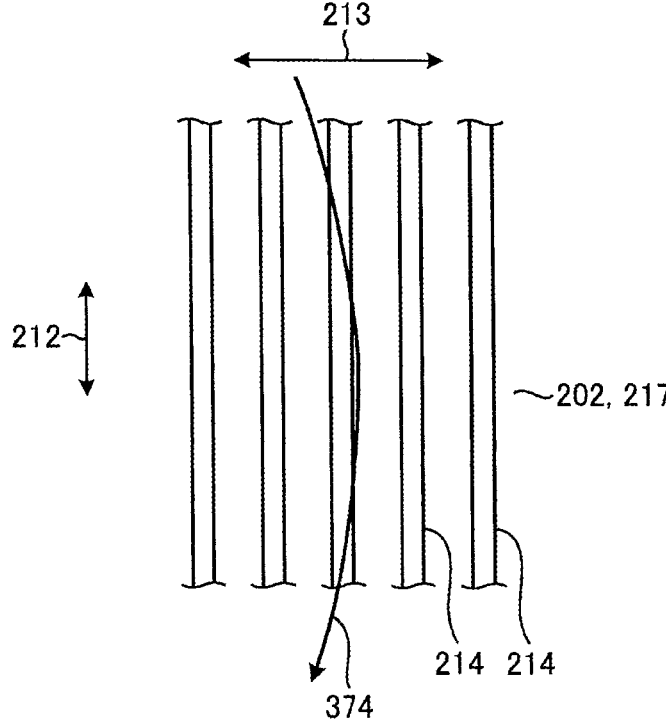
FIG. 18 is a plan view schematically depicting a moving path of heat spots across a second region in a comparative example.

FIG. 11 is a cross-sectional view of the annular frame 204 of the wafer unit 200 as fixed by the frame fixing unit 11 of the heating unit 30 in the heating step 1002 of the expansion method depicted in FIG. 9. FIG. 12 is a cross-sectional view of the sheet 202 expanded in the heating step 1002 of the expansion method depicted in FIG. 9. FIG. 13 is a cross-sectional view of the wafer unit 200 held by suction on the holding table 32 of the heating unit 30, and the push-up members 361 and the holding table 32 lowered in the heating step 1002 of the expansion method depicted in FIG. 9. FIG. 14 is a cross-sectional view of the slack in the region 215 of the sheet 202 as being heated in the heating step 1002 of the expansion method depicted in FIG. 9. FIG. 15 is a plan view schematically depicting a moving path of the heating elements 372 that heat the slack in the region 215 of the sheet 202 in the heating step 1002 of the expansion method depicted in FIG. 9. FIG. 16 is a plan view schematically depicting a moving path of heat spots 374 across a portion XVI in FIG. 15. FIG. 17 is a plan view schematically depicting a moving path of heat spots 374 across a portion XVII in FIG. 15. FIG. 18 is a plan view schematically depicting a moving path of heat spots 374 across a second region 217 in a comparative example.

In the heating step 1002, after the expansion step 1001 has been performed, the sheet 202 is heated in the region 215 between the outer periphery of the wafer 201 and the inner periphery of the annular frame 204 by the heating elements 372 of the heating assembly 37, whereby the slack in the region 215 of the sheet 202, the slack having been formed in the expansion step 1001, is allowed to shrink. In the heating step 1002, the expanding machine 1 lowers the frame mount plate 15 of the frame fixing unit 11 of the dividing unit 10, and transfers the wafer unit 200 from the frame mount plate 33 onto the paired second guide rails 7 by the third transfer unit 53.

In the heating step 1002, the expanding machine 1, with the push-up members 361 and the holding table 32 of the heating unit 30 lowered and the frame holding plate 34 of the frame fixing unit 31 positioned at the set-back position, transfers the wafer unit 200 from the second guide rails 7 onto the upper surface 332 of the frame mount plate 33 by the second transfer unit 52.

In the heating step 1002, the expanding machine 1 brings the centering guides 333 of the frame fixing unit 31 closer to each other to position the wafer 201 of the wafer unit 200. In the heating step 1002, the expanding machine 1 raises the frame mount plate 33, and as depicted in FIG. 11, holds and fixes the wafer unit 200 between the frame mount plate 33 and the frame holding plate 34.

In the heating step 1002, the expanding machine 1 raises the push-up members 361 and holding table 32 of the heating unit 30, and as depicted in FIG. 12, stretches the region 215 of the expanded sheet 202 to form space between the adjacent chips 210. In the heating step 1002, the expanding machine 1 opens the on-off valve 326 to draw air from the suction portion 323 by the suction source 325, whereby the wafer 201 is held on the side of the back surface 211 thereof by suction on the holding surface 321 via the sheet 202, and the space is maintained between the adjacent chips.

In the heating step 1002, the expanding machine 1, as depicted in FIG. 13, lowers the push-up members 361 downward beyond the upper surface 332 of the frame mount plate 33, and also lowers the holding table 32 until the holding surface 321 is located on the same plane as the upper surface 332 of the frame mount plate 33. Slack then occurs in the region 215 of the sheet 202.

In the heating step 1002, the expanding machine 1 lowers the heating assembly 37 of the heating unit 30, and brings the heating elements 372 facing the region 215 of the sheet 202. In the heating step 1002 of the first embodiment, the expanding machine 1 energizes all the heating elements 372 of the heating assembly 37 of the heating unit 30, and allows all the heating elements 372 to circle as many times as predetermined at a predetermined circle speed above the region 215 while radiating the infrared rays 373 from all the heating elements 372. The expanding machine 1 therefore heats and shrinks the slack in the region 215 over the entire periphery thereof in the heating step 1002.

In the heating step 1002 of the first embodiment, the expanding machine 1 moves the heating elements 372, which are located right above the second regions 217, in other words, the heat spots 374 which are located in the second regions 217, in the radial direction of the wafer 201 as indicated by arrows 218 in FIG. 15, and also moves the heating elements 372, which are located right above the first regions 216, in other words, the heat spots 374 which are located in the first regions 216, on a center in the radial direction of the region 215 along the outer periphery of the wafer 201. In the heating step 1002 of the first embodiment, the expanding machine 1 therefore moves the heat spots 374 in a circle on the first regions 216 along the outer periphery of the wafer 201, and moves the heating elements 372 of the heating assembly 37 above the second regions 217 such that the heat spots 374 reciprocate between dead points on an outer periphery side and dead points on an inner periphery side in the radial direction of the wafer 201. In the heating step 1002, the expanding machine 1 therefore allows the heat spots 374 to pass on a plurality of molecular chains 214 by moving the heat spots 374 to intersect molecular chains 214 in the first regions 216 as depicted in FIG. 16, and radially moving the heat spots 374 in the second regions 217 so that they intersect the molecular chains 214 as depicted in FIG. 17.

In the heating step 1002 of the first embodiment, the expanding machine 1 therefore moves the heating elements 372 of the heating assembly 37 so as to reciprocate the heat spots 374 in the radial direction of the wafer 201 in the second regions 217, thereby moving the heating elements 372 of the heating assembly 37 such that the heat spots 374 are positioned over the entirety of at least the second regions 217. It is to be noted that the expression "moving the heating elements 372 of the heating assembly 37 such that the heat spots 374 are positioned over the entirety of at least the second regions 217" as used herein means, in the first embodiment, to allow the heat spots 374 to pass on a plurality of molecular chains 214 in the second regions 217 by moving the heat spots 374 in a peripheral direction of the wafer 201 while radially moving the heat spots, so that they intersect the molecular chains 214.

(Rinsing Step)

In the rinsing step 1003, after the heating step 1002 has been performed, the wafer 201 is rinsed by the rinsing unit 40. In the rinsing step 1003, the expanding machine 1 stops the circulation and energization of the heating elements 372 of the heating assembly 37 of the heating unit 30, lowers the frame mount plate 33 of the frame fixing unit 31 of the heating unit 30, and stops the suction holding of the holding table 32. In the rinsing step 1003, the expanding machine 1 transfers the wafer unit 200 to the rinsing unit 40 by the second transfer unit 52.

In the rinsing step 1003, the expanding machine 1 rinses the wafer unit 200 by the rinsing unit 40. In the rinsing step 1003, the expanding machine 1 transfers the wafer unit 200 from the rinsing unit 40 to the cassette 4 by the second transfer unit 52 and first transfer unit 51, whereby the wafer unit 200 is stored in the cassette 4. The expanding machine 1 sequentially expands the sheets 202 of the individual wafer units 200 in the cassette 4 to divide the wafers 201 into individual chips 210. When the sheets 202 of all the wafer units 200 in the cassette 4 are expanded and the wafers 201 are divided into the individual chips 210, the expanding machine 1 ends the processing operation.

When the sheet 202 is heated by the heating elements 372, the infrared rays 373 radiated from the heating elements 372 locally heat the sheet 202 right below the radial centers of the heating elements 372, and heat spots 374 of a temperature higher than that of the surrounding sheet 202 are formed right below the radial centers of the heating elements 372.

However, compared with the comparative example depicted in FIG. 18 in which heat spots 374 are allowed to pass, in other words, move along molecular chains 214 in the second regions 217 by moving the heating elements 372 in the peripheral direction above the second regions 217, in other words, the heat spots 374 in the peripheral direction in the second regions 217, the expansion method according to the first embodiment allows the heat spots 374 to pass on more molecular chains 214 in the second regions 217 by radially moving the heating elements 372 above the second regions 217, in other words, the heat spots 374 in the second regions 217. The expansion method according to the first embodiment therefore performs heating such that the heat spots 374 are positioned over the entirety of the region 215 in at least the second regions 217 where the sheet 202 is hard to shrink, and therefore can suppress localized heating of the sheet 202 especially in the second regions 217. As a result, the expansion method according to the first embodiment can bring about an advantageous effect that the expanded sheet 202 is allowed to shrink by heating.

Second Embodiment

Figure 19:
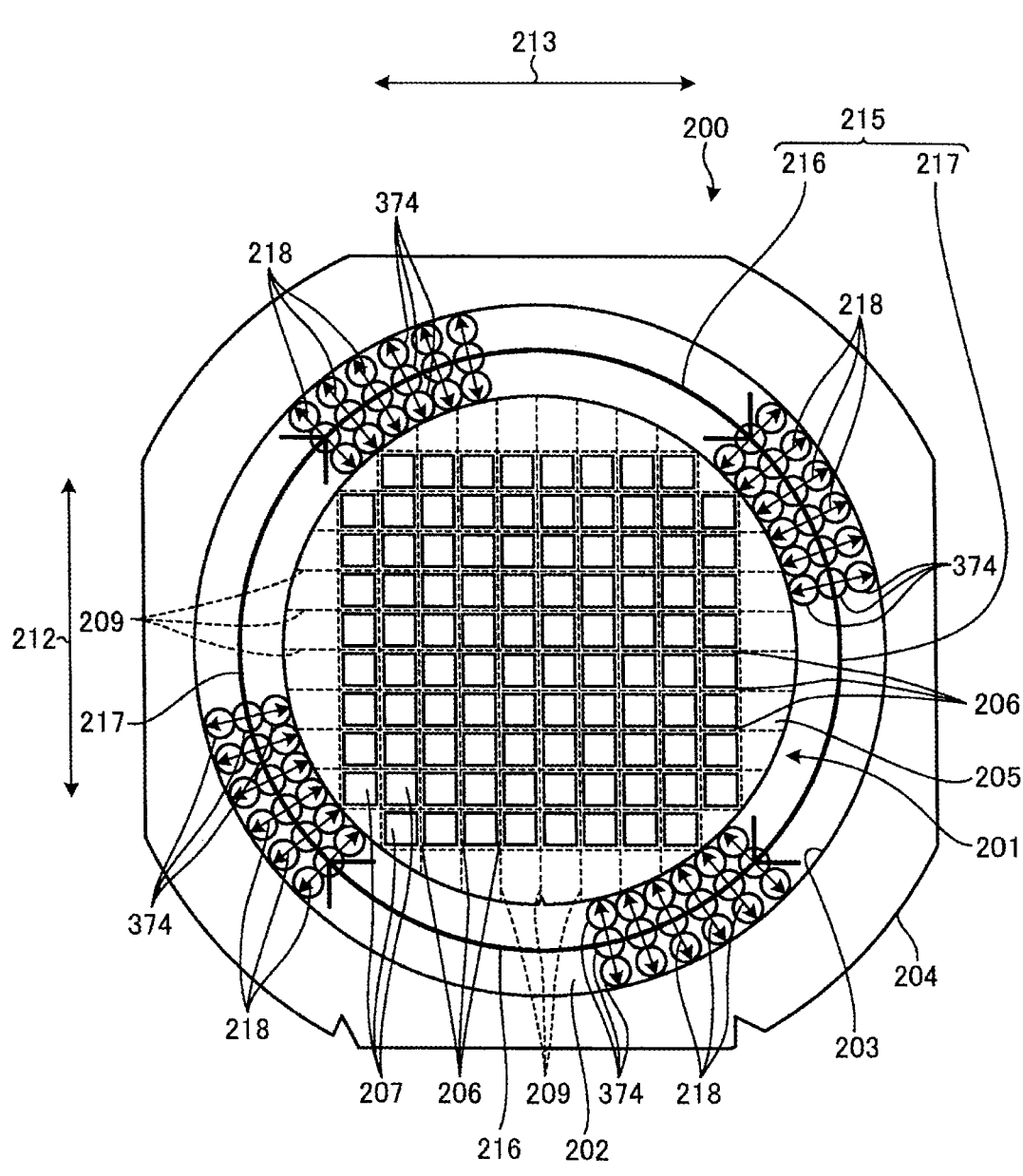
FIG. 19 is a plan view schematically depicting a moving path of the heating elements that heat slack in a region to be heated of a sheet in a heating step of an expansion method according to a second embodiment of the present invention.

An expansion method according to a second embodiment of the present invention will be described based on FIG. 19. FIG. 19 is a plan view schematically depicting a moving path of the heating elements 372 that heat slack in a region 215 to be heated of a sheet 202 in a heating step of the expansion method according to the second embodiment. It is to be noted that, in FIG. 19, the same elements, portions and the like as those in the first embodiment are identified by the same reference numerals as in the first embodiment, and their description is omitted.

The expansion method according to the second embodiment is the same as the expansion method according to the first embodiment except that its heating step 1002 is different from the first embodiment. In the heating step 1002 of the expansion method according to the second embodiment, the expanding machine 1 moves the heating elements 372 which are located right above first regions 216 and second regions 217, in other words, heat spots 374 which are located in the first regions 216 and second regions 217, in a radial direction of a wafer 201 as indicated by arrows 218 in FIG. 19. In the heating step 1002 of the expansion method according to the second embodiment, the expanding machine 1 therefore moves the heating elements 372 of the heating assembly 37 above the first regions 216 and second regions 217 so that the heat spots 374 reciprocate between dead points on the outer periphery side and dead points on the inner periphery side in the radial direction of the wafer 201.

In the heating step 1002 of the expansion method according to the second embodiment, the expanding machine 1, as described above, moves the heating elements 372 of the heating assembly 37 above the first regions 216 and second regions 217 so that the heat spots 374 reciprocate in the radial direction of the wafer 201. The heating elements 372 of the heating assembly 37 are therefore moved such that the heat spots 374 are positioned over the entirety of at least the second regions 217. It is to be noted that the expression "the heating elements 372 of the heating assembly 37 are moved such that the heat spots 374 are positioned over the entirety of the second regions 217" as used herein means, in the second embodiment, to allow the heat spots 374 to pass on a plurality of molecular chains 214 in the second regions 217 by moving the heat spots 374 so that they intersect the molecular chains 214.

The expansion method according to the second embodiment allows the heat spots 374 to pass on the molecular chains 214 in the second regions 217 by radially moving the heating elements 372 above the second regions 217, in other words, the heat spots 374 in the second region 217, and therefore performs heating so that the heat spots 374 are positioned over the entirety of the region 215 in at least the second regions 217 where the sheet 202 is hard to shrink. As a result, the expansion method according to the second embodiment can bring about the advantageous effect that the expanded sheet 202 is allowed to shrink by heating.

Third Embodiment

Figure 20:
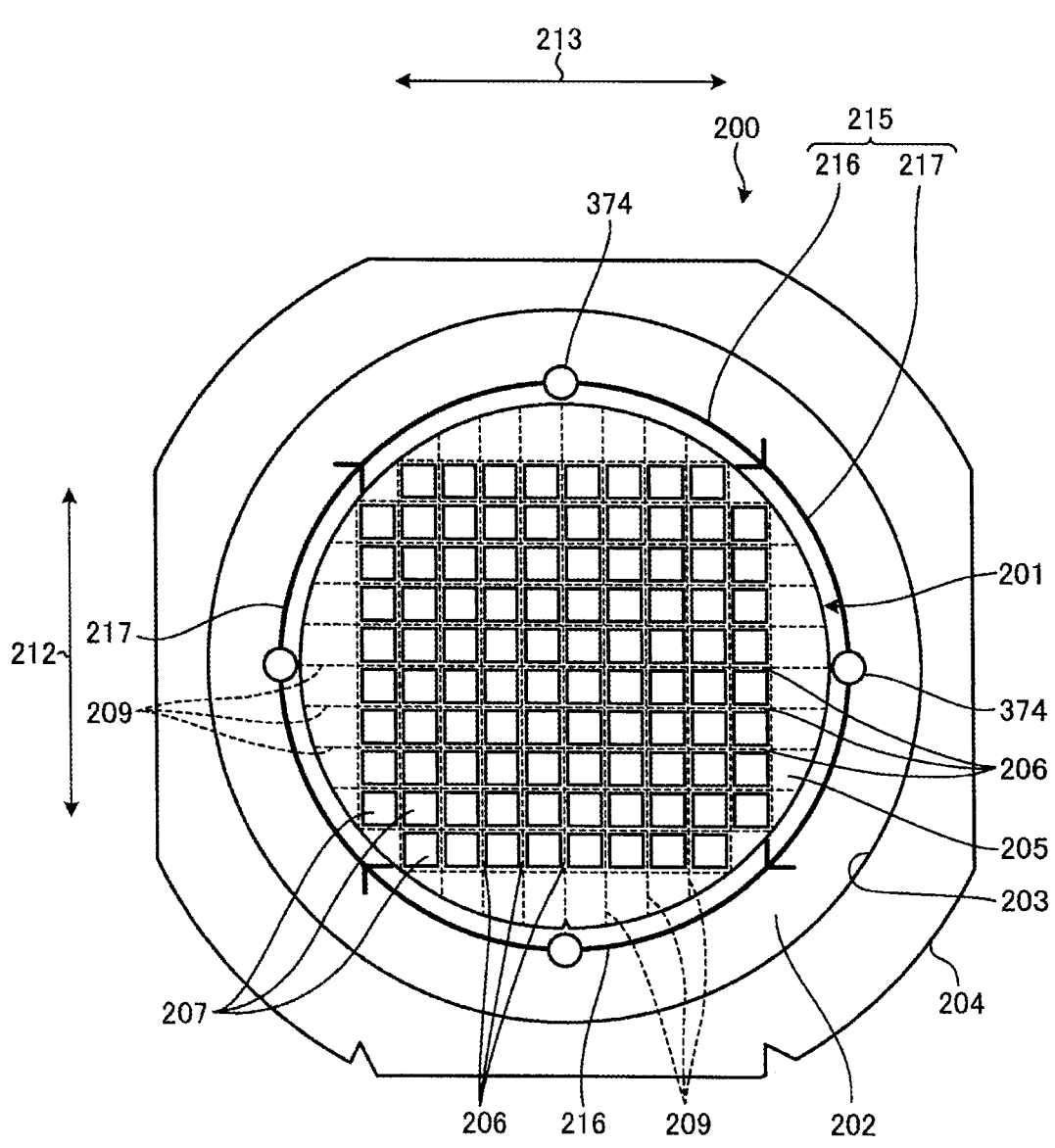
FIG. 20 is a plan view schematically depicting a moving path of the heating elements that heat an innermost periphery of a region to be heated of a sheet in a heating step of an expansion method according to a third embodiment of the present invention.
Figure 21:
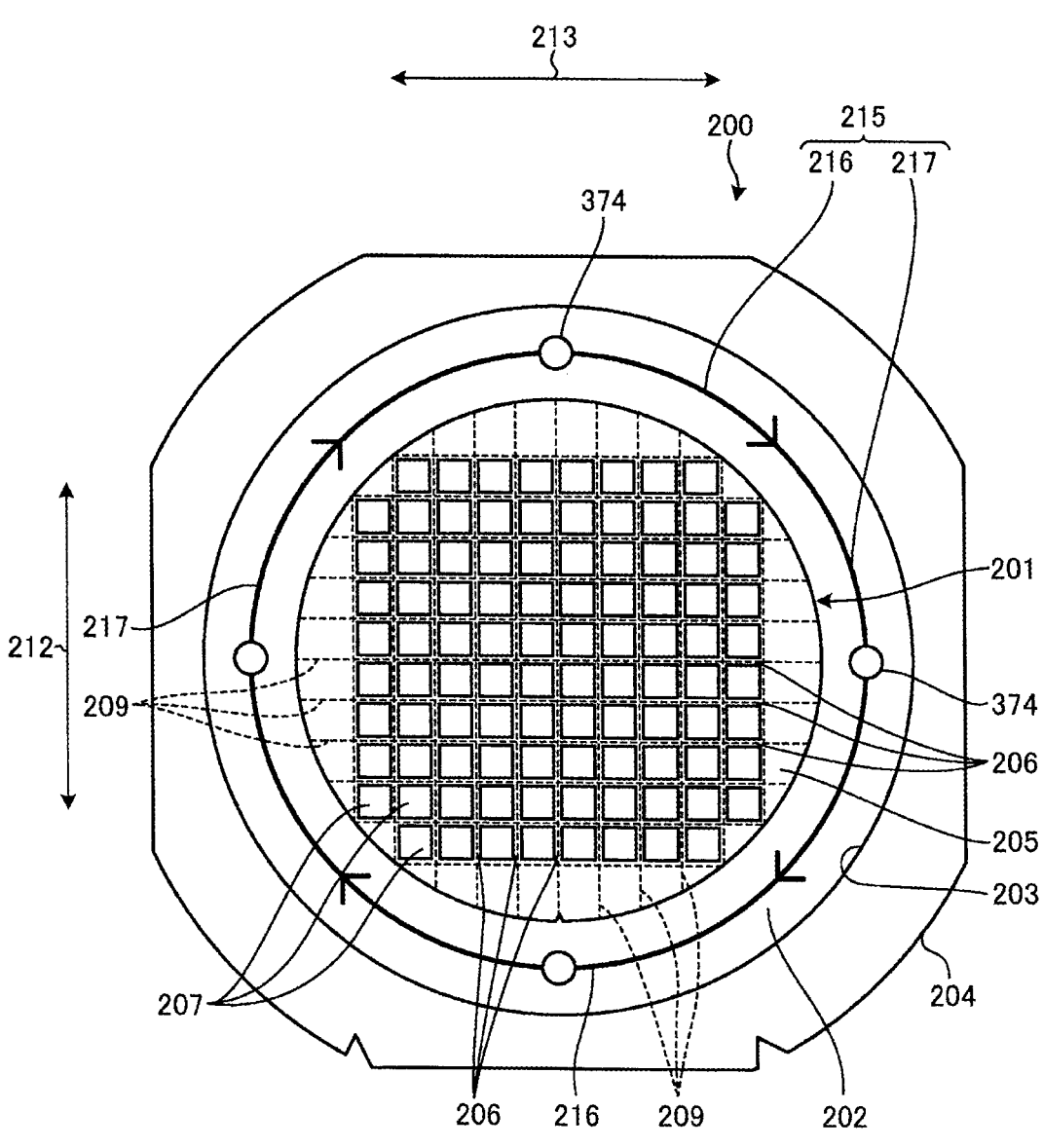
FIG. 21 is a plan view schematically depicting a moving path of the heating elements that heat a center in a radial direction of the region to be heated of the sheet in the heating step of the expansion method according to the third embodiment.
Figure 22:
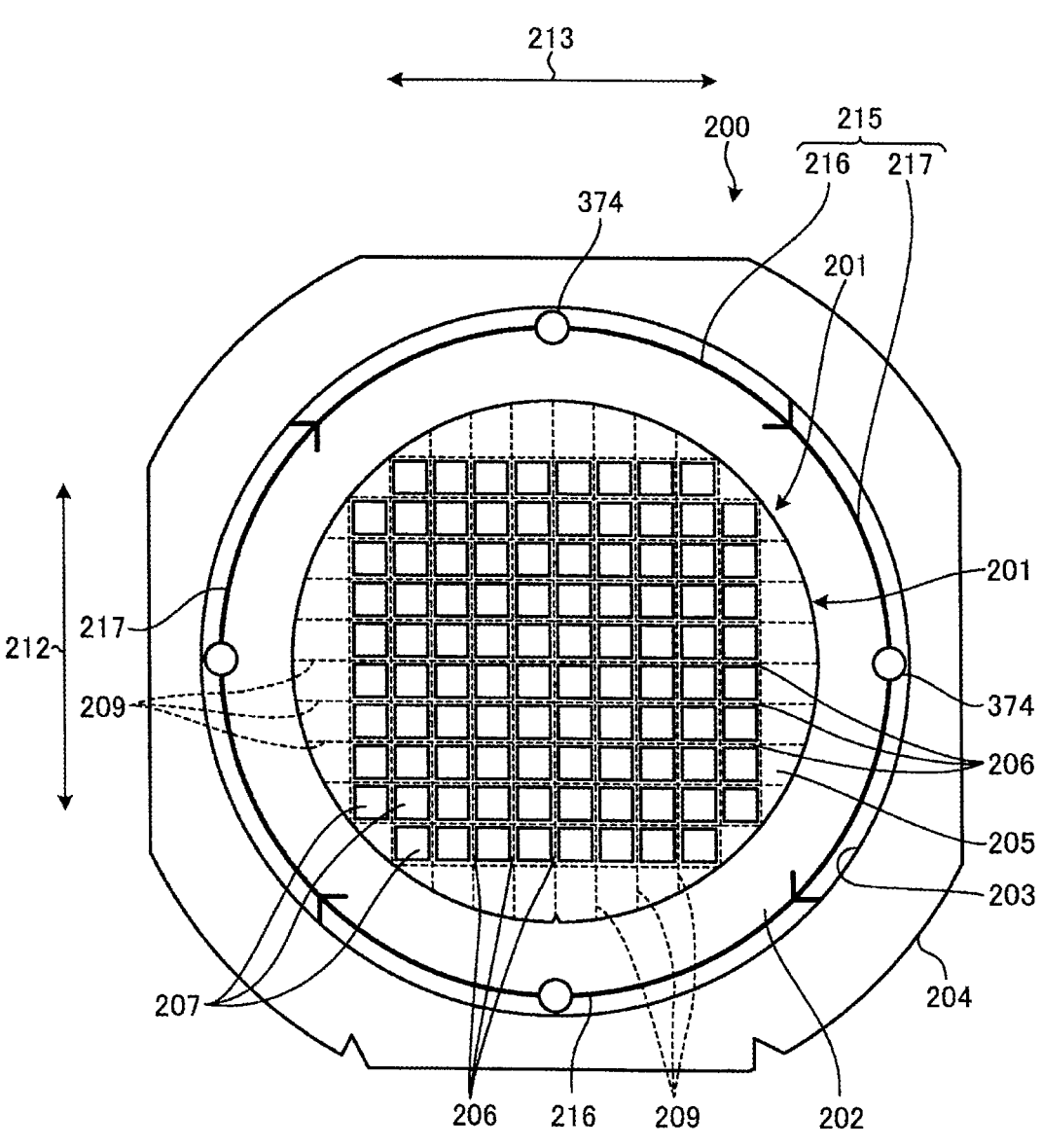
FIG. 22 is a plan view schematically depicting a moving path of the heating elements that heat an outermost periphery of the region to be heated of the sheet in the heating step of the expansion method according to the third embodiment.

An expansion method according to a third embodiment of the present invention will be described based on FIGS. 20, 21 and 22. FIG. 20 is a plan view schematically depicting a moving path of the heating elements 372 that heat a radially innermost periphery of a region 215 to be heated of a sheet 202 in a heating step of the expansion method according to the third embodiment. FIG. 21 is a plan view schematically depicting a moving path of the heating elements 372 that heat a center in a radial direction of the region 215 to be heated of the sheet 202 in the heating step of the expansion method according to the third embodiment. FIG. 22 is a plan view schematically depicting a moving path of heating elements 372 that heat a radially outermost periphery of the region 215 to be heated of the sheet 202 in the heating step of the expansion method according to the third embodiment. It is to be noted that, in FIGS. 20, 21 and 22, the same elements, portions and the like as those in the first embodiment are identified by the same reference numerals as in the first embodiment, and their description is omitted.

The expansion method according to the third embodiment is the same as the expansion method according to the first embodiment except that its heating step 1002 is different from the first embodiment. In the heating step 1002 of the expansion method according to the third embodiment, the expanding machine 1 heats the region 215 of the sheet 202 in its entirety by moving the heating elements 372 so that the heat spots 374 move in concentric circles on the region 215. In the heating step 1002 of the expansion method according to the third embodiment, the expanding machine 1, as depicted in FIG. 20, positions all the heating elements 372, in other words, heat spots 374 above or on a radially innermost periphery of the region 215, and allows the heat spots 374 to circle as many times as predetermined in a circle on the first regions 216 and second regions 217 along an outer periphery of a wafer 201.

In the heating step 1002 of the expansion method according to the third embodiment, the expanding machine 1, as depicted in FIG. 21, then positions all the heating elements 372, in other words, heat spots 374 above or on the radial center of the region 215, and allows the heat spots 374 to circle as many times as predetermined in a circle on the first regions 216 and second regions 217 along the outer periphery of the wafer 201. In the heating step 1002 of the expansion method according to the third embodiment, the expanding machine 1, as depicted in FIG. 22, next positions all the heating elements 372, in other words, heat spots 374 above or on the radially outmost periphery of the region 215, and allows the heat spots 374 to circle as many times as predetermined in a circle on the first regions 216 and second regions 217 along the outer periphery of the wafer 201.

In the heating step 1002 of the expansion method according to the third embodiment, the expanding machine 1 therefore allows the heat spots 374 to move along a plurality of molecular chains on the second regions 217 by successively positioning the radial positions of the heating elements 372, in other words, the heat spots 374 at the three different positions and successively moving the heating elements 372, in other words, the heat spots 374 which have been positioned at the respective positions, in circles, respectively, along the outer periphery of the wafer 201. It is to be noted that, in the heating step 1002 of the third embodiment, the expanding machine 1 allows the heating elements 372, in other words, the heat spots 374 to move in circles along the outer periphery of the wafer 201 by successively positioning the radial positions of the heating elements 372, in other words, the heat spots 374 at the three different positions. In the invention, however, the heating elements 372, in other words, the heat spots 374 may be positioned successively at radially different two positions, or may be positioned successively at radially different four or more positions.

In the heating step 1002 of the third embodiment, the expanding machine 1, as described above, successively positions the radial positions of the heating elements 372, in other words, the heat spots 374 at the three different positions, and successively moves the heating elements 372, in other words, the heat spots 374 which have been positioned at the respective positions, in circles along the outer periphery of the wafer 201. The expanding machine 1 therefore moves the heating elements 372 of the heating assembly 37 so that the heat spots 374 are positioned over the entirety of at least the second regions 217. It is to be noted that the expression "moves the heating elements 372 of the heating assembly 37 so that the heat spots 374 are positioned over the entirety of at least the second regions 217" as used herein means, in the third embodiment, to allow the heat spots 374 to pass along the molecular chains 214 in the second regions 217.

The expansion method according to the third embodiment successively positions the radial positions of the heating elements 372, in other words, the heat spots 374 at the three different positions, and successively moves the heating elements 372, in other words, the heat spots 374 which have been positioned at the respective positions, in circles along the outer periphery of the wafer 201, and therefore performs heating so that the heat spots 374 are positioned over the entirety of the region 215 in at least the second regions 217 where the sheet 202 is hard to shrink. As a result, the expansion method according to the third embodiment can bring about the advantageous effect that the expanded sheet 202 is allowed to shrink by heating.

It should be noted that the present invention shall not be limited to the above-described embodiments. In other words, the present invention can be practiced with various modifications within the scope not departing from the spirit of the present invention. In the first embodiment, the modified layers 209 are formed as division starting points. Without being limited such modified layers, the present invention may form laser processed grooves or cut grooves as division starting points.

Further, the expansion method of the present invention may widen the distance between the adjacent chips 210 even if the wafer 201 of the wafer unit 200 has been divided into the individual chips 210 along the scribe lines 206 by dividing grooves formed in the scribe lines 206. In the present invention, the wafer unit 200 may include a die attach film (hereinafter referred to as "DAF") bonded to the back surface 211 of the wafer 201. The DAF is a die-bonding adhesive film for fixing the individually divided chips 210 on other chips, substrates, or the like.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. An expansion method for expanding a sheet of a wafer unit including a wafer being bonded to the sheet, and an annular frame having an opening with the wafer accommodated therein and carrying the sheet bonded at an outer peripheral edge thereof to the annular frame, the method comprising:

an expansion step of expanding the sheet between an outer periphery of the wafer and an inner periphery of the annular frame in the wafer unit; and a heating step of, after performing the expansion step, heating the sheet in a region between the outer periphery of the wafer and the inner periphery of the annular frame by a heating unit to allow slack in the sheet to shrink, the slack having been formed in the expansion step, wherein the region to be heated in the sheet includes a first region and a second region that is harder to shrink by the heating than the first region, on the sheet, heat spots of a temperature higher than that of the sheet surrounding the heat spots are formed with heat radiated from the heating unit to the sheet, and in the heating step, the heating unit is moved such that the heat spots are positioned over the second region and reciprocate in a radial direction between the outer periphery of the wafer and the inner periphery of the annular frame a plurality of times in one path of the heating unit through the second region, and in a circular path in the first region between the outer periphery of the wafer and the inner periphery of the annular frame in the one path of the heating unit through the first region.

\* \* \* \* \*